United States Patent [19]

Kurosawa et al.

[11] Patent Number: 5,157,700
[45] Date of Patent: Oct. 20, 1992

[54] EXPOSURE APPARATUS FOR CONTROLLING INTENSITY OF EXPOSURE RADIATION

[75] Inventors: Hiroshi Kurosawa; Mitsuaki Amemiya; Shigeru Terashima, all of Atsugi; Koji Uda, Yokohama; Isamu Shimoda, Zama; Shunichi Uzawa, Nakamachi; Kunitaka Ozawa, Isehara; Makiko Mori, Atsugi; Ryuichi Ebinuma, Kawasaki; Shinichi Hara, Atsugi; Nobutoshi Mizusawa, Yamato; Eigo Kawakami, Ebina, all of Japan

[73] Assignee: Canon Kabushiki Kaisha, Tokyo, Japan

[21] Appl. No.: 401,615

[22] Filed: Aug. 31, 1989

[30] Foreign Application Priority Data

| Sep. 2, 1988 | [JP] | Japan | 63-218522 |
| Sep. 7, 1988 | [JP] | Japan | 63-222251 |
| Sep. 7, 1988 | [JP] | Japan | 63-222253 |
| Sep. 8, 1988 | [JP] | Japan | 63-223483 |
| Sep. 13, 1988 | [JP] | Japan | 63-227388 |
| Sep. 13, 1988 | [JP] | Japan | 63-227389 |
| May 26, 1989 | [JP] | Japan | 1-133795 |

[51] Int. Cl.$^5$ .................................................. G21K 5/00
[52] U.S. Cl. .......................................... 378/34; 378/97; 378/108
[58] Field of Search ................. 378/34, 35, 97, 108, 378/146, 160; 250/492.2; 355/37, 53, 71

[56] References Cited

U.S. PATENT DOCUMENTS

| 4,176,281 | 11/1979 | Tischer et al. | 378/34 |
| 4,512,657 | 4/1985 | Sakato | 355/69 |
| 4,804,978 | 2/1989 | Tracy | 346/76 L |
| 4,870,452 | 9/1989 | Tanimoba et al. | 355/43 |
| 4,916,322 | 4/1990 | Glavish et al. | 378/34 |

Primary Examiner—David P. Porta
Attorney, Agent, or Firm—Fitzpatrick, Cella, Harper & Scinto

[57] ABSTRACT

An exposure apparatus usable with synchrotron radiation source wherein the synchrotron radiation is generated by electron injection into a ring. The exposure apparatus is to transfer a semiconductor element pattern of a mask onto a semiconductor wafer by the synchrotron radiation. The apparatus includes a shutter for controlling the exposure of the wafer. The shutter controls the exposure with the illuminance distribution on the wafer surface taken into account. The illuminance distribution is determined in response to the electron injection, and thereafter, the illuminance distribution is corrected in a predetermined manner. By this, the illuminance distribution data for controlling the shutter always correspond to the actual illuminance distribution. The entire shot areas of the semiconductor wafer are exposed with high precision.

47 Claims, 29 Drawing Sheets

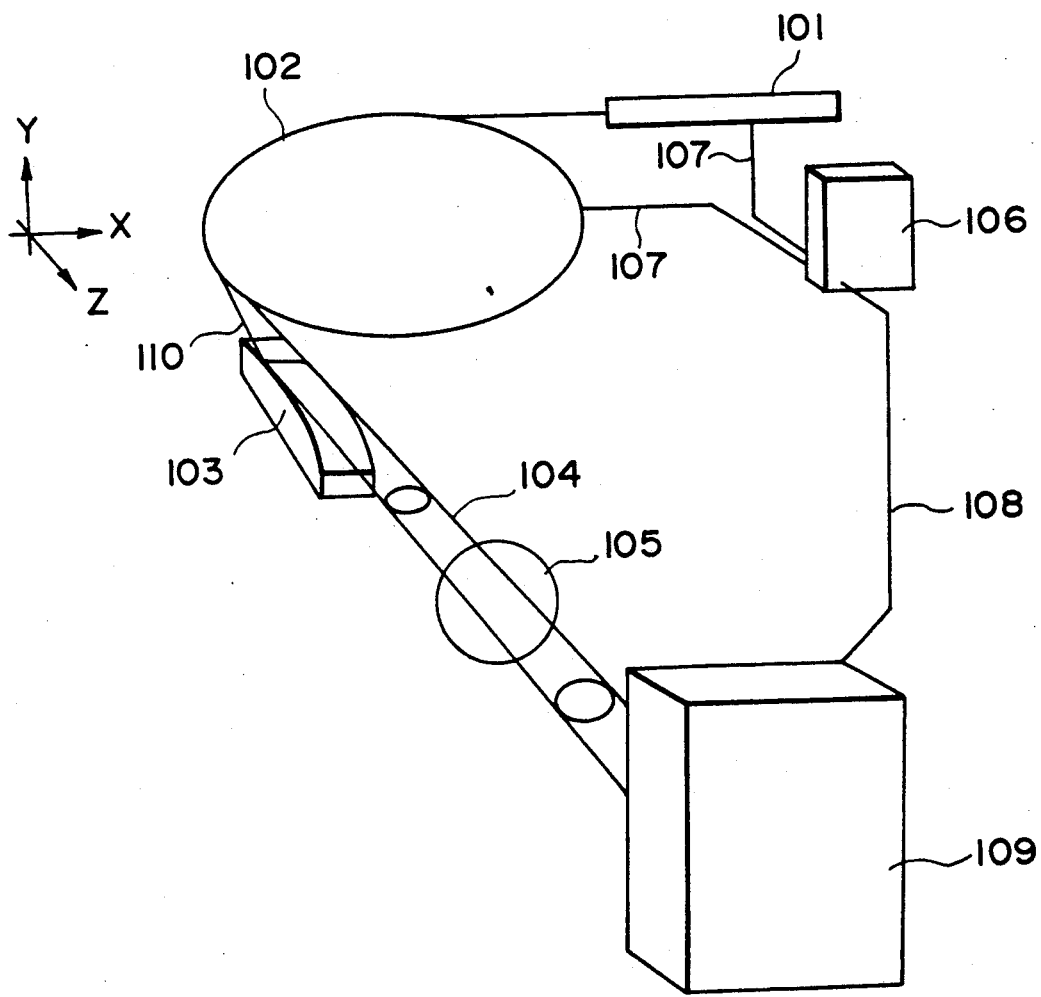
F I G. 6

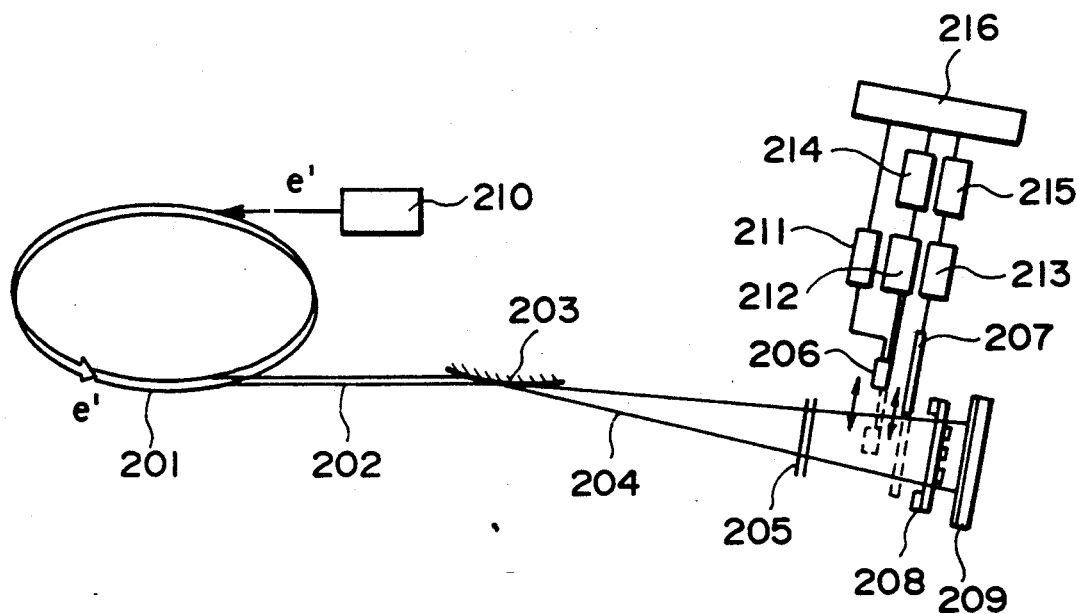
F I G. 10
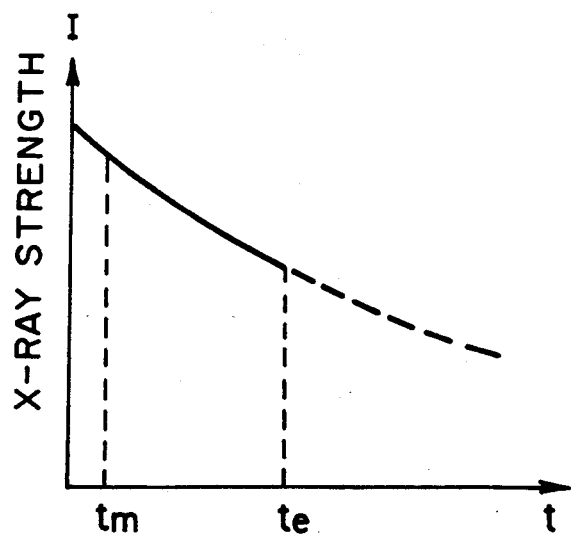
F I G. 11

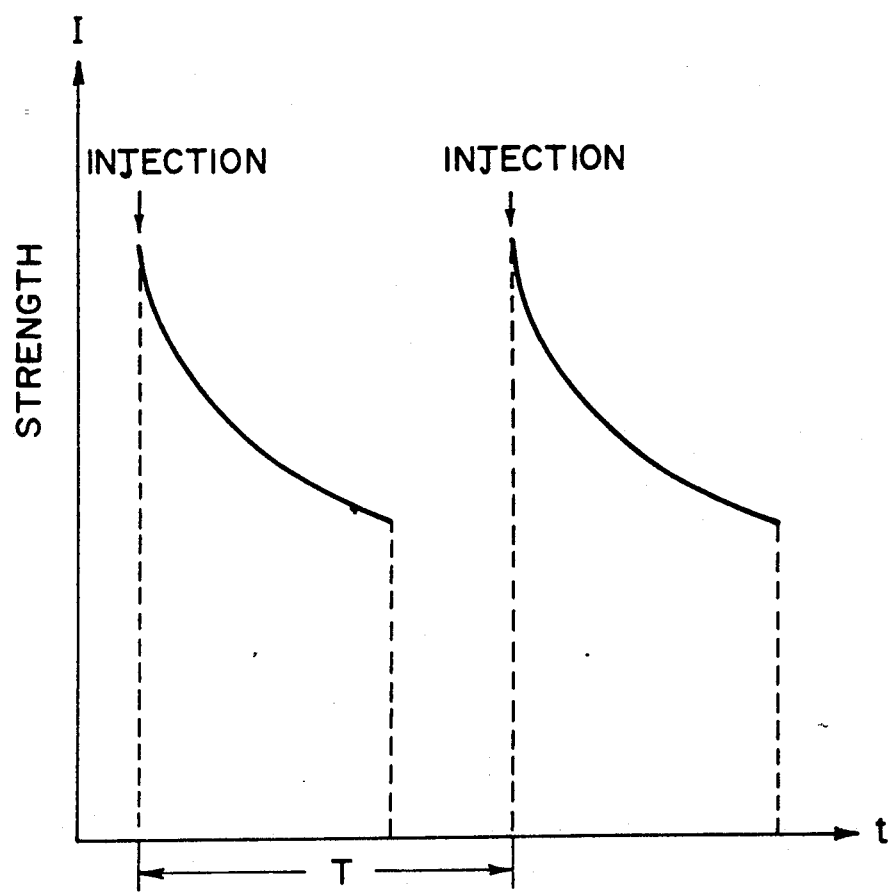
F I G. 32
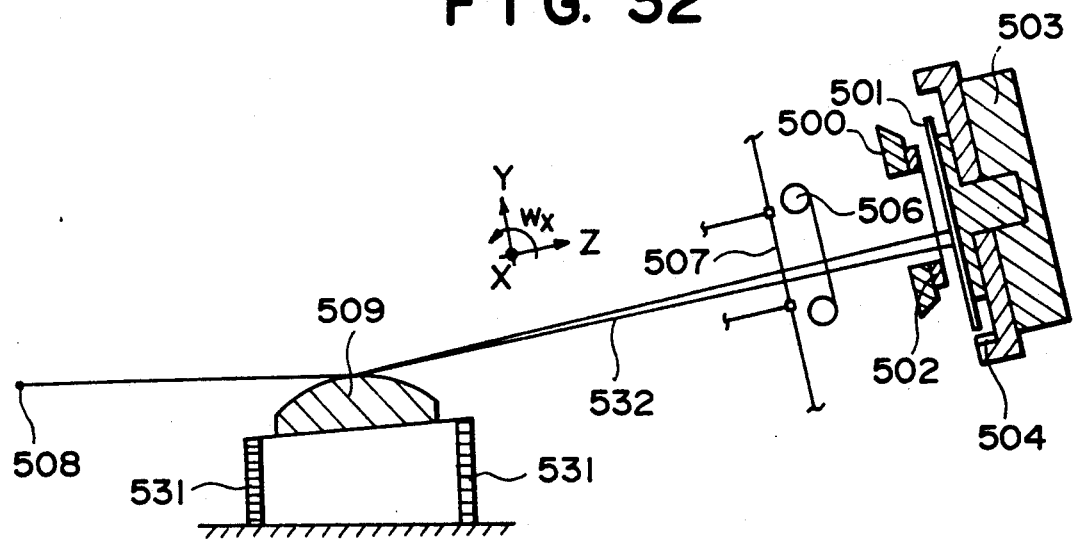
F I G. 33

|  | ADDRESS |
|---|---|
| 00H | 0000H |
| 01H | 0002H |
| 01H | 0004H |
| 02H | 0006H |
| 03H | 0008H |
| 05H | 000AH |
| 08H | 000CH |
| 0FH | 000EH |
| 18H | 0010H |
| ⋮ | |

FIG. 37

EXPOSURE APPARATUS FOR CONTROLLING INTENSITY OF EXPOSURE RADIATION

FIELD OF THE INVENTION AND RELATED ART

The present invention relates to a mask pattern transferring exposure apparatus used in manufacturing semiconductor devices, and more particularly to an exposure apparatus which uses as a radiation source a synchrotron radiation source.

An exposure apparatus, which uses synchrotron radiation emitted when high energy electrons make a circular orbit motion, is known. The synchrotron radiation has a wide and uniform intensity distribution in a horizontal plane that is in a plane including the circular orbit. However, the beam width measured in the vertical direction is very much limited. In order to expand the beam width in the vertical direction, there are proposed various methods. In one method, a mirror is disposed in an optical path between the synchrotron radiation source and the member to be exposed to the radiation, and the mirror is swung to scan the member to be exposed (Japanese Laid-Open Patent Applications Nos. 45026/1981 and 113065/1986; "Investigation of X-ray exposure using plane scanning mirrors" J. Vac. Sci. Techol. vol. 31, (4) p.1271, 1983, by M. Bieber, H. U. Sheunemann, H. Betz, A. Heuberger). In another example, the electron orbit in the accumulation ring of the radiation source is vertically swung by application of a magnetic field ("stationary large area exposure in synchrotron radiation lithography utilizing a new arrangement of magnets applied to the storage ring", Jpn. Appl. Phys., 22; L718-L720, 1983, H. Tanio, K. Hoh). A further example is that a fixed mirror is disposed in an optical path from the radiation source to the member to be exposed to provide a large exposure area having a uniform beam intensity (variation of the beam intensity is not more than ±5% in an area of 3×3 cm$^2$) ("Design of Stationary Troidal Mirror for Large Area Synchrotron Radiation Exposure", preprint for the 31st Applied Physics Meeting, 282, 1984, by Koji Tanino and Ohtori Koichiro, and Japanese Laid-Open Patent Application No. 84814/1985).

Referring to FIG. 1, an example of an exposure apparatus using synchrotron radiation is shown. In FIG. 1, reference numerals 1, 5 and 6 are respectively a synchrotron radiation beam, a mask and a semiconductor wafer which is to be exposed to the radiation. The apparatus comprises a stationary or fixed mirror 2 for expanding the synchrotron beam, an exposure chamber 3 filled with helium gas or the like, a window 4 of the exposure chamber 3 made of beryllium, a wafer stage 7, a spring 8, a wafer stage driver 9 and a frame 10. The apparatus further comprises movable aperture steps 11 and 12, supporting members 13 and 14 for the movable aperture steps and drivers 15 and 16 for the movable aperture steps. The movable apertures 11 and 12, the supporting members 13 and 14 and the drivers 15 and 16 constitute an exposure control means. Designated by a reference 17 is an ultra-high vacuum chamber which is isolated from the exposure chamber 3 containing the helium gas by the window 4.

In operation, light (radiation) 1 travels through the ultra-high vacuum chamber 17 and is expanded by the mirror 2, and is passed through the window 4. The exposure control means controlled by a shutter controller 20 limits the light 1, and the limited light is projected onto the semicondutor wafer 6 through the mask 5, by which the pattern of the mask is transferred onto the semiconductor wafer 6.

SUMMARY OF THE INVENTION

In the exposure apparatus using the synchrotron radiation source, the strength or intensity distribution of the radiation beam is narrow in the direction perpendicular to the plane of the accumulation ring. Therefore, it is preferable to expand the intensity distribution in this direction by one method or another. For the purpose of this expansion, Japanese Laid-Open Patent Applications Nos. 141135/1986 and 59828/1986 disclose that the synchrotron radiation is passed through a monocrystal or a diffraction grating so as to expand the divergence angle measured in the vertical plane. The beam provided thereby, as it is, involves non-uniformity and variation in the spectral distribution in the vertical direction, so that it is still not possible to project the mask pattern onto the wafer with a uniform exposure amount. Then, Japanese Laid-Open Patent Application No. 104438/1981 discloses that a shutter is driven with a control to make uniform the exposure amount over each of many shot areas on the basis of exposure beam profiles predicted beforehand.

However, in the conventional art, since there is no practical sequential operation for determining a profile of the synchrotron radiation incident on the mask, the data for determining the profile is not accurate.

Accordingly, the first object of the present invention is to provide an exposure apparatus wherein the exposure control is possible on the basis of synchrotron radiation profile data which is accurately obtained and which is high in the S/N ratio (signal/noise ratio).

According to an aspect of the present invention, the synchrotron radiation beam profile is measured or sensed when the intensity of the radiation from the synchrotron radiation generator is substantially highest, that is, when the transmissivity of the radiation through the window disposed in the radiation path from the synchrotron radiation generator to a mask in the exposure apparatus, by which the exposure control can be performed, on the basis of the radiation beam profile data having substantially the highest S/N ratio.

With the increase of the pattern density in integrated circuit devices, the line width of the pattern transferred by the exposure decreases, and the control of the line width in the resist becomes more severe. As is well known, the line width formed in the resist changes greatly depending on variation in the exposure amount. Therefore, it is important that the actual amount of exposure is controlled correctly to be the desired amount. As for the system for correctly controlling the amount of exposure, Japanese Laid-Open Applications Nos. 101839/1982 and 198726/1984 disclose that the intensity of the exposure radiation during the exposure operation is detected by a detector disposed adjacent to the mask, and upon the desired amount of exposure reached, a shutter is closed.

However, it is difficult to use the conventional art of the X-ray exposure for the synchrotron radiation (SOR). This is because, in the conventional apparatus, the area in which the intensity of the exposure radiation is uniform is relatively wide, and therefore, a measurement at the marginal area of the mask is not much different from the intensity in the exposure area, but in the SOR exposure, the region in which the intensity of the SOR is uniform is narrow, so that the X-ray intensity is different at the marginal measuring position than at the exposure area.

To obviate this problem, it is considered that a retractable X-ray detector is advanced into the exposure area when the exposure operation is not carried out, and it detects the X-ray intensity, whereas during the exposure, the detector is retracted so as not to block the X-rays. However, when the X-ray intensity varies with time as in SOR, it is possible that the X-ray intensity is different at the time of the exposure than at the time of measurement, with the result of an additional error.

Accordingly, a second object of the present invention is to provide an X-ray exposure apparatus which can determine the X-ray intensity with high accuracy even if the SOR is used.

According to an aspect of the present invention, after the electron is injected into the SOR ring to generate the synchrotron radiation, the intensity of X-rays is measured, and the X-ray intensity during the exposure operation is determined on the basis of the measurement and on an attenuation curve of the injected electron.

In this system, the X-ray intensity during an exposure operation for a shot can be correctly predicted both from one or more X-ray measurements after the orbit electron injection and from the attenuation curve of the orbit electron amount.

Further, in order to achieve the second object, in the X-ray exposure apparatus according to an embodiment of the present invention, the X-ray or light intensities are simultaneously measured within the exposure area and outside the exposure area after the electron injection into the SOR ring, and thereafter, the exposure control is performed on the basis of an output of the measuring device disposed outside the exposure area.

In the X-ray exposure apparatus, the desired amount of exposure is provided by controlling the exposure period. The following methods are considered for accomplishing this:

(1) The exposure period is determined on the basis of the sensitivity, to the X-rays, of the sensitive resist applied on the wafer and the X-ray illuminance empirically determined: and (2) As disclosed in Japanese Laid-Open Patent Application 198726/1985, an X-ray detector is disposed at a proper position in the X-ray illumination area, by which the variation of the X-ray illuminance with time is detected, and on the basis of the detection, the exposure period is controlled.

However, in those methods, the exposure period is uniform over the entire exposure area on the wafer surface, and therefore, when, for example, the radiation source is a synchrotron radiation source, non-uniformness results in the exposure area of the wafer, and in addition, the correction thereof is not possible.

Accordingly, a third object of the present invention is to provide an exposure apparatus wherein the exposure operation can be performed with a uniform amount of exposure over the entire wafer even if the synchrotron radiation or the like is used.

According to an aspect of the present invention, the exposure apparatus according to an embodiment of the present invention includes aperture means (shutter), disposed between the radiation source and the member to be exposed and movable in a direction crossing the direction of illumination of the radiation rays, control means (controlling the opening and closing of the shutter) for controlling movement of the aperture means so as to provide a uniform radiation intensity distribution on the member to be exposed, a radiation sensor for measuring the exposure amount by the radiation rays, and feed-back means for feeding the result of the measurement to the control means. By this, the exposure amount becomes uniform over the entire exposure area even if the radiation source is a synchrotron radiation source.

In an illuminance measuring system for light using a semiconductor, when a high measurement accuracy is required, a chopper is used adjacent the light source to block the light pulsewisely in order to correct for dark current which is a problem from the standpoint of the measurement correctness. The chopped light is received by an illuminance sensor. The dark current component inherent to the semiconductor sensor is corrected by measuring the AC component of the illuminance sensor output. However, as for the illuminance measurement in the exposure apparatus using variable wavelength light, even if the semiconductor sensor is used, the variation in the dark current is very small, and therefore, it is practically not necessary to correct it, and it will suffice if the DC component is measured.

However, in the exposure apparatus using high energy radiation such as X-rays, when the semiconductor sensor is used for the purpose of measurement of the illuminance, the temperature of the semiconductor sensor itself increases by the illumination with the exposure radiation, by which the dark current varies, with the result that the correct illuminance is not obtained.

Referring to FIG. 2, there is shown a relation in a graph between the sensor output current with time when the semiconductor sensor is exposed to X-rays having a constant intensity. As will be understood from this Figure, even if the X-ray intensity does not change, the dark current increases due to the temperature rise of the sensor, and therefore, the output of the sensor is as if the X-ray intensity changes.

In order to avoid this, it would be possible to use the above-described method wherein the dark current is corrected, which, however, necessitates the sensor to be provided with a chopper. This results in an inconvenience of an increased number of drivers.

Accordingly, a fourth object of the present invention is to provide an exposure apparatus wherein the dark current of the semiconductor components can be corrected, and therefore, the illuminance of the exposure radiation can be measured with high accuracy without a necessity of an additional driving mechanism.

According to an embodiment of the present invention, there is provided an exposure apparatus wherein a semiconductor sensor for measuring the illuminance is disposed behind the exposure shutter with respect to the radiation source; upon measurement, an exposure shutter is opened and closed, and an output of the sensor is produced in synchronism with the opening and closing of the shutter; and the output is signal-processed to calculate the illuminance of the exposure radiation.

Therefore, the high measurement accuracy can be accomplished without the necessity of increasing the number of driving parts in the exposure apparatus.

As disclosed in Japanese Laid-Open Patent Application No. 276223/1986, it is known that in an exposure apparatus wherein the light from a light source is reflected by a mirror and is then projected onto a mask, the mirror is vibrated to control the amount of exposure within the exposure angle in the mask to be a given or constant amount.

In this case, it is necessary to determine a driving profile for controlling the swinging vibration of the mirror. The driving profile has to be produced in consideration of an intensity distribution of the light incident on the mirror, intensity variation of the emergent light due to a change in the angle of incidence, the change in the spectral distribution or the like when the light source is, for example, a synchrotron radiation source, the intensity of the radiation attenuates at least during several hours as periods, and therefore, various driving profiles have to be produced for respective shots meeting the attenuation. This places a heavy burden on the controller for controlling the exposure apparatus.

Accordingly, it is a fifth object of the present invention to provide an exposure apparatus wherein the driving profile is compensated for in accordance with the radiation intensity characteristics change of the radiation source with time to assure the uniformity of exposure amount on the exposure surface without much burden imparted on the controller.

According to an embodiment of the present invention, an absolute intensity of the radiation provided by the radiation source is measured, and in accordance with the change of the detected intensity, the time axis of the driving profile is proportionally expanded or contracted, thus eliminating the necessity for the process of producing a new driving profile for each change in the intensity of the radiation by the radiation source. Therefore, the controller is not given the heavy burden. More particularly, the exposure apparatus according to this embodiment includes an exposure radiation source, a stage for supporting a member to be exposed; optical control means for controlling the radiation projected from the radiation source to the member to be exposed; optical measurement means for measuring the intensity of the radiation provided by the exposure radiation source or the illuminance on the surface to be exposed; driving profile determining means for determining the driving profile of the optical control means, wherein the profile determining means is coupled with the optical control means and optical measuring means, and provides a uniform exposure amount on the surface to be exposed in consideration of the illuminance on the surface to be exposed as a function of a position of the surface to be exposed and the radiation intensity characteristics of the radiation source; and driving profile compensating means for expanding and contracting the time axis of the driving profile in accordance with a change of the radiation intensity characteristics of the radiation source.

In a preferred embodiment, the exposure radiation source is a synchrotron radiation source, and the optical control means includes a movable aperture. In another preferred embodiment, the exposure radiation source is a synchrotron, and the optical control means includes an actuator for swingingly driving a mirror.

Referring to FIG. 3, there is shown a movable aperture, in an enlarged scale, employed in the apparatus of FIG. 1. In this Figure, aperture limiting members 11 and 12 are movable in a y direction, and an aperture limiting member 20 is movable in an x direction constitute the movable aperture. More particularly, the edge surfaces 18 and 19 define the aperture. The synchrotron radiation passes through the limited opening or aperture in the z direction to within the view angle 21. As shown in FIG. 4, if the beam intensity at the aperture position is uniformly constant also in the y direction, the edge surface 18 of the aperture limiting member is moved in the y direction at a constant speed determined by $(y_2-y_1)/\Delta T$ in accordance with the operation curve (1) in FIG. 5 during the time period of $\Delta T$ from the point of time T1 at which the aperture limiting members 11 and 12 are contacted to close the aperture. Thereafter, it is stopped at the position indicated in FIG. 3. Then, the edge surface 19 of the aperture limiting member is moved in accordance with the operation line (2) in the +y direction at a constant speed determined by $(y_1-y_1)/\Delta T$ during the period of $\Delta T$ from the point of time $(T1+\Delta T)$. Then, it is brought into contact with the aperture limiting member 11 which has advanced and stopped. Thus, the exposure amount in the view angle 21 is constant, so that the wafer is uniformly exposed.

If the strength of the beam is constant at the position of the aperture, the exposure amount of the view angle 21 is constant, and the member to be exposed is uniformly exposed. Actually, however, it is not constant, and in addition, the radiation intensity attenuates with time due to collisions of the electrons to the inside wall of the accumulation ring or gas molecules. For this reason, the exposure amount is not uniform within the angle of view, and therefore, there is a problem that the pattern of the mask is not uniformly formed on the wafer with high resolution.

Accordingly, it is a sixth object of the present invention to provide an exposure apparatus wherein the exposure amount within the angle of view is made uniform, thus assuring the uniform exposure.

According to an embodiment of the present invention, a driving speed of a movable member of an exposure control means for making uniform the exposure amount of the member to be exposed is determined in accordance with the attenuation characteristics with time of the illumination intensity to the member to be exposed, and the movable member of the exposure means or the stage supporting the member to be exposed is driven at the speed thus determined.

More particularly, according to the embodiment of the present invention, there is provided an exposure apparatus, including an illumination source, a stage for supporting a member to be illuminated, exposure control means including a movable member for selectively limiting the light from the illumination source to the member to be illuminated, means for determining the driving speed in accordance with the attenuation (with time) characteristics of the illumination intensity to the member to be illuminated to provide a constant amount of exposure, and driving means for driving the movable member of the exposure control means or the stage at a speed thus determined. In a preferred embodiment, the exposure control means includes a movable aperture stop or a movable mirror.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 6 is a general arrangement of the exposure apparatus according to an embodiment of the present invention.

FIG. 10 is a general arrangement of an X-ray exposure apparatus according to another embodiment of the present invention.

FIG. 11 is a graph showing change in X-ray intensity I with time t.

FIG. 22 is a schematic view showing the driving and controlling sections for a stage, shutter and the like.

FIG. 32 is a graph showing the intensity change of the synchrotron radiation source.

FIG. 33 is a general arrangement of another exposure apparatus to which the present invention is applicable.

FIG. 37 shows an actuator driving table in the apparatus of the FIG. 36 embodiment.

DETAILED DESCRIPTION OF THE PREFERRED EMBODIMENTS

Figure 1:
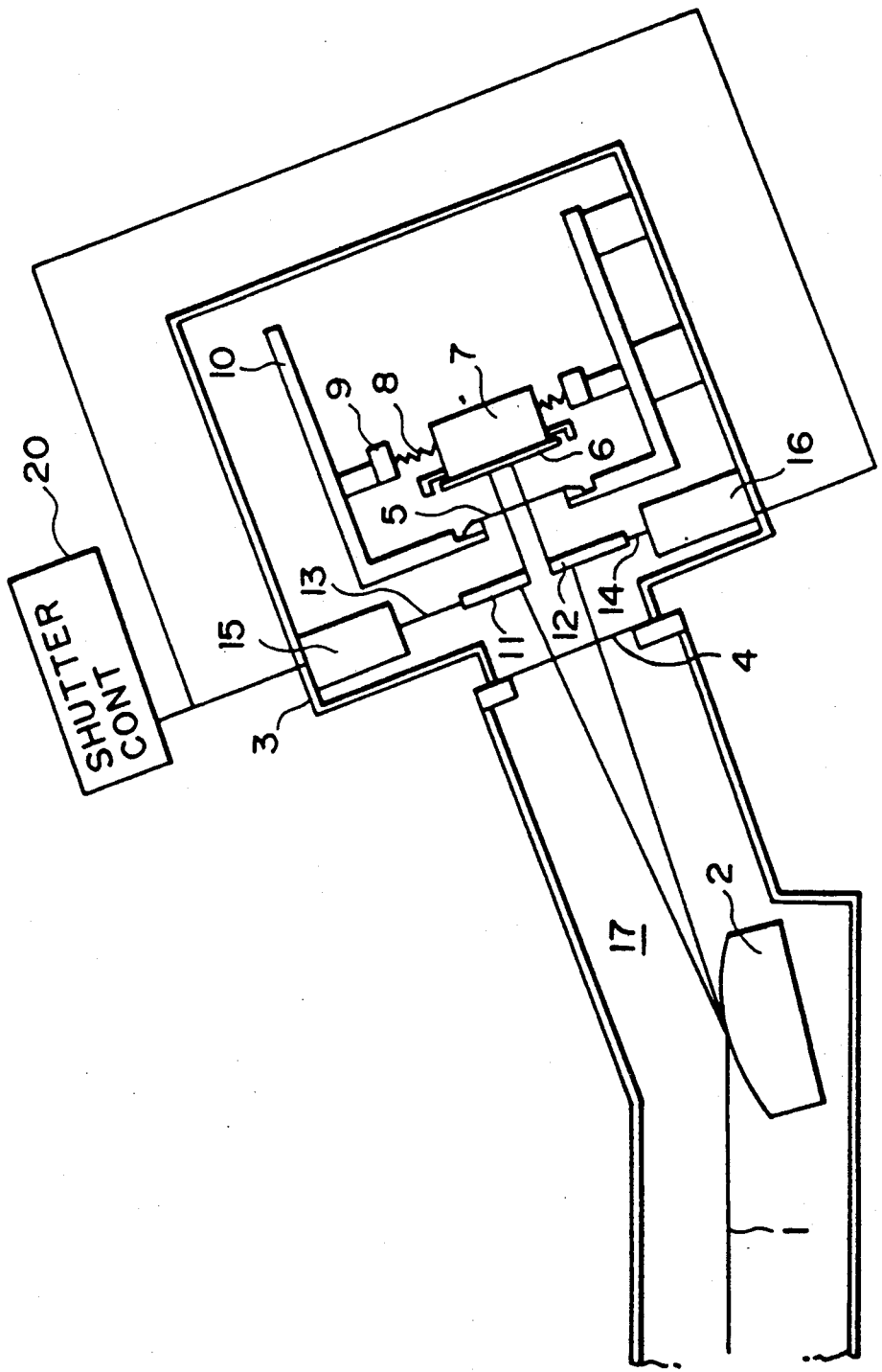
FIG. 1 schematically shows a conventional exposure apparatus.
Figure 2:
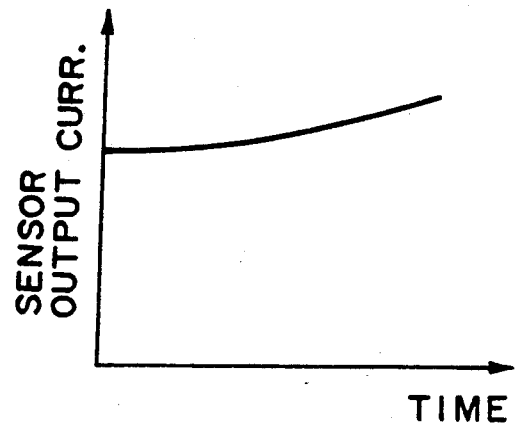
FIG. 2 is a graph of sensor output current vs. time when the sensor is exposed to X-rays having a constant intensity.

Referring to FIG. 6, there is shown an exposure apparatus according to an embodiment of the present invention. In this Figure, reference numerals 101 and 102 designate a linear accelerator and an accumulation ring, respectively. The linear accelerator 101 serves to inject electrons into the ring 102. The linear accelerator 101 and the ring 102 are connected to a controller 106 for controlling the synchrotron system through a control line 107, so that a synchrotron radiation generating apparatus is constituted. Since the controller 106 is connected to an exposure apparatus 109 through a communication line 108, the electron injection timing by the linear accelerator 101 is transmitted to the exposure apparatus 109, so that the exposure apparatus 109 can be synchronously operated in accordance with an output of the synchrotron. The synchrotron radiation 110 produced from the accumulation ring 102 is expanded in the divergence angle in a Y direction (vertical direction) by an X-ray reflecting mirror 103 into an expanded radiation beam 104, which is introduced into the exposure apparatus through a transmitting window 105. The window 105 is durable against a pressure difference between the synchrotron side and the exposure apparatus side, and is made of beryllium or the like.

Figure 7:
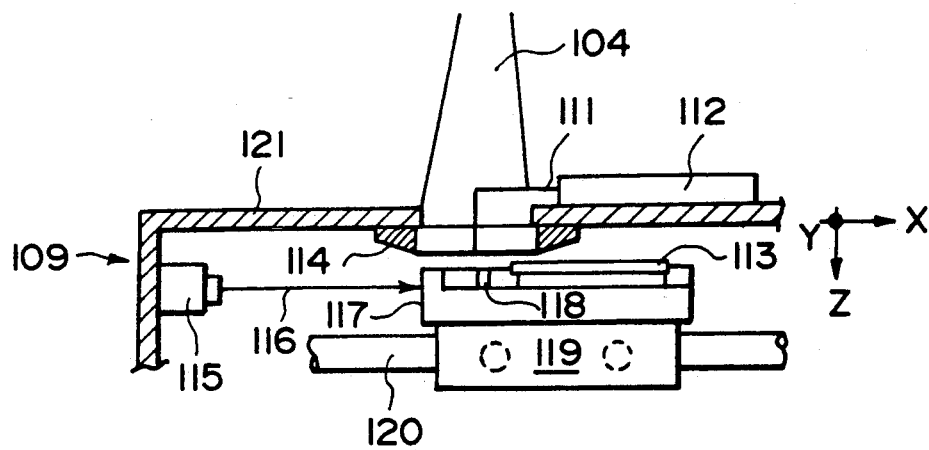
FIG. 7 shows one of the major parts of the exposure apparatus shown in FIG. 6.

FIG. 7 is a sectional view of an inside of the exposure apparatus 109 of FIG. 6, seen from a positive (+) side of the y axis. The exposure apparatus 109 is provided with a casing or frame 121. To the frame, a shutter 111 and a shutter controlling unit 112 are mounted to control the amount of synchrotron radiation 104 incident on the mask 114 and a wafer 113. To a stage 119 for supporting the wafer 113, an X-ray detector 118 for measuring the intensity of the incident X-ray is mounted, so that the X-ray intensity is detected through the mask 114 at any position in an exposure shot area by movement of the stage.

A laser interferometer 115, its optical axis 116, a mirror 117 on the stage 119 and a guide 120 constitute a control system for positioning the stage 119 in an X-Y plane with high accuracy.

Figure 8:
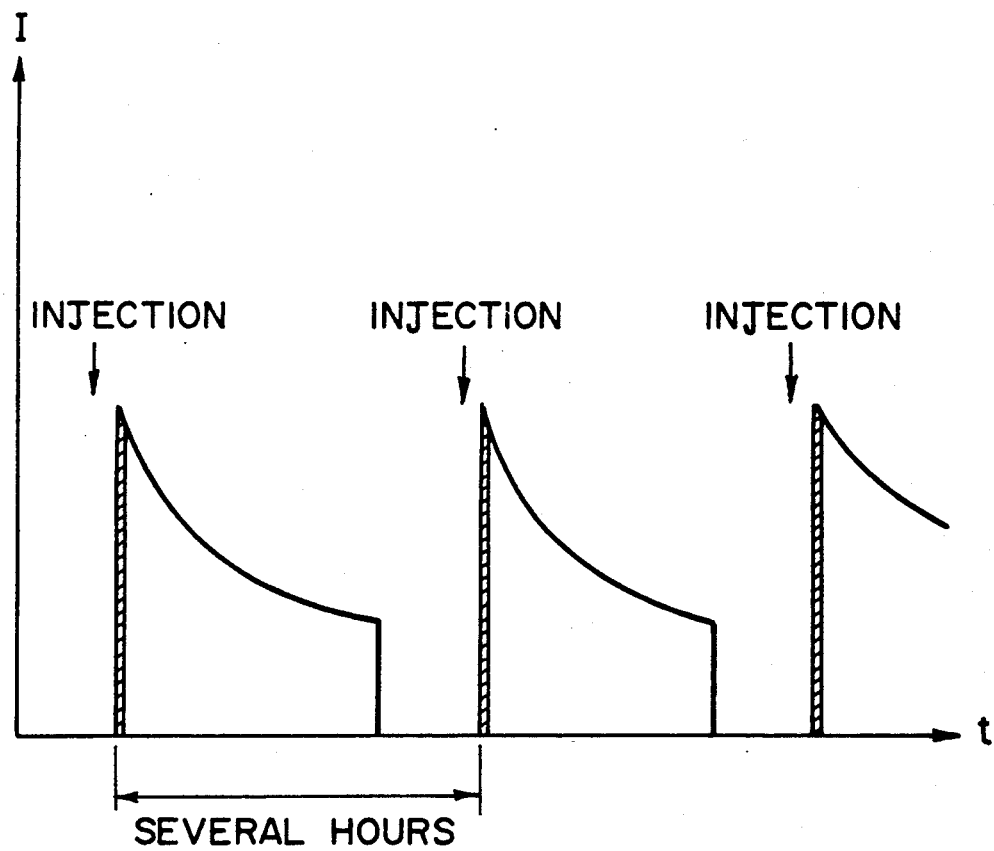
FIG. 8 is a graph illustrating change, with time, of the intensity of synchrotron radiation.

FIG. 8 is a graph showing a change of the radiation intensity of the radiation produced by the synchrotron radiation generator with time. Once the linear accelerator 101 injects electrons into the ring 102, the intensity of the synchrotron radiation logarithmically decreases with time. The interval period of the electron injections is different depending on the individual synchrotron rings, but it is generally several hours. The hatched portion in the graph indicates the time period in which the profile (illuminance distribution) of the synchrotron radiation intensity incident on the exposure apparatus 109 is measured. As will be understood, the intensity measurement is performed when the intensity of the incident synchrotron radiation is substantially highest, by which the data has substantially the highest S/N ratio. In the case of the synchrotron radiation, as shown in FIG. 8, even if the absolute level decreases, the profile itself for each of the electron injections does not change.

The measuring step is applied to the time when the material covering the window 105 is exchanged. When the material is beryllium, it is contaminated more and more with a normal exposure operation of the exposure apparatus 109 with the result of reduction of the transmissivity. Therefore, the profile is stored on the assumption that the contamination occurs uniformly over the entire area of the transmitting window 105.

Figure 9:
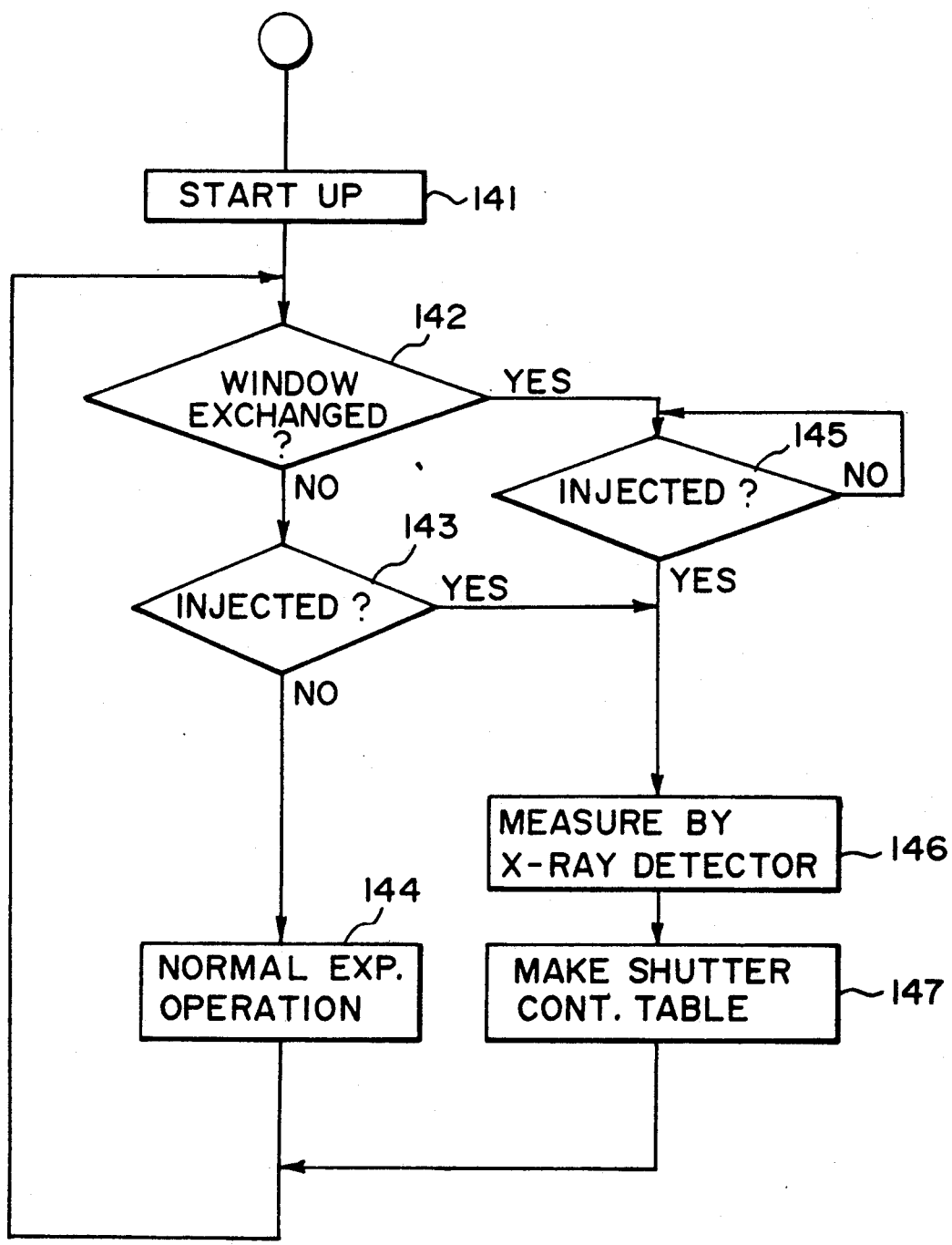
FIG. 9 is a flow chart showing operations of the exposure apparatus shown in FIG. 6.

FIG. 9 is a flow chart showing the process steps in the operation. At step 141, the exposure apparatus 109 is started. At step 142, the discrimination is made as to whether or not the window material 105 is exchanged. If it is exchanged, the electron injection into the ring 102 is delayed (step 145). After the injection, the X-ray detector 118 detects the profile (step 146). The measurement is performed for each of several positions predetermined within the exposure area, while the stage 119 carrying the X-ray detector 118 is moved on the X-Y plane, more particularly, along the Y axis. On the basis of the data of the profile measurement, a shutter controlling table is produced (step 147). If the material covering the window 105 is not exchanged, the discrimination is made as to whether or not the electron injections into the ring 102 are carried out or not at step 143. If it is immediately after the electron injection, the sequence goes to step 146 where the X-ray detector 118 effects measurement to determine illuminance distribution. If the electron injection is not carried out, the normal exposure operation is performed (step 144). When the profile does not much change for the respective electron injections, it is possible to advance to the normal exposure operation (step 144) similar to the case of no electron injection, even immediately after the electron injection.

As described, according to this embodiment, the illuminance distribution of the synchrotron radiation adjacent the mask 114 or the wafer 113 is determined on the basis of the measurement immediately after the electron injection into the ring 102 after the exchange of the window 105 material, by which the profile data can be obtained with a high S/N ratio.

FIG. 10 is a general arrangement of an X-ray exposure apparatus according to another embodiment of the present invention, wherein a fixed mirror is used. In this Figure, a reference numeral 201 designates an SOR ring. The apparatus comprises an X-ray mirror 203, an X-ray transmitting window made of beryllium (Be) or the like, a movable X-ray detector 206 and a shutter 207. Designated by reference numerals 208 and 209 are an X-ray mask and a wafer coated with a resist sensitive to the SOR radiation. The synchrotron radiation 202 is expanded by the X-ray mirror 203 into expanded radiation (X-ray) 204. The apparatus further comprises an electron injector 210, a signal processor 211, an X-ray detector driver 212, a shutter driver 213, an X-ray detector controller 214, a shutter controller 215 and a CPU (central processing unit) 216. Generally, an exposure operation using the SOR is started after low energy electrons are injected by the injector 210 into the SOR ring 201, and they are accelerated up to a predetermined energy level. However, the number of electrons injected gradually decreases due to the collision with gas molecules or the like remaining in the orbit in the SOR ring 201, with the result that the intensity of the radiation decreases. Therefore, when the number of orbit electrons or the intensity of the radiated X-rays becomes below a predetermined, the electrons are stopped, and the exposure operation is interrupted. Thereafter, the electrons are injected again, and then the exposure operation is resumed.

Figure 12:
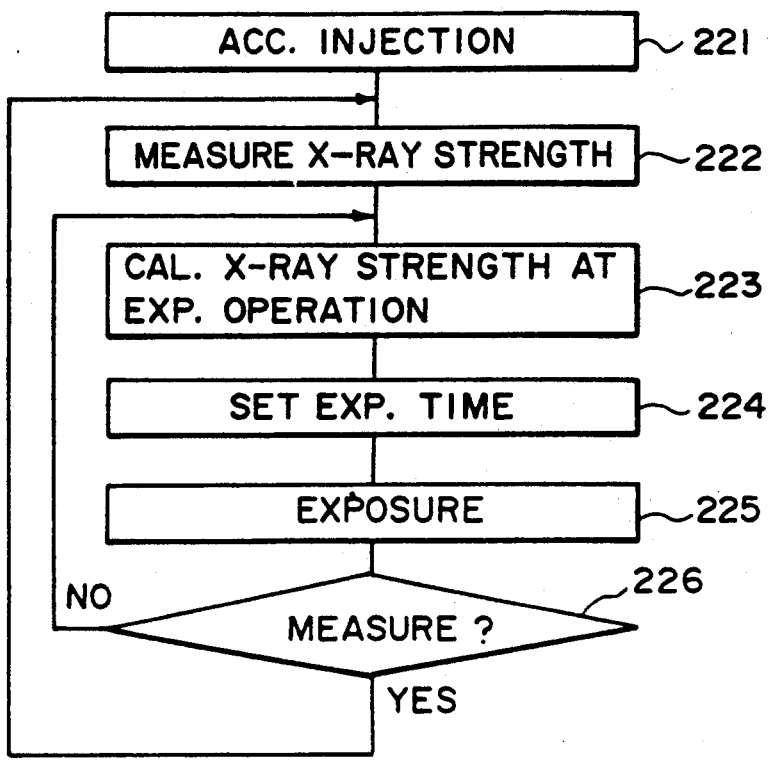
FIG. 12 is a flow chart illustrating operations of the apparatus of FIG. 10.

Referring to FIG. 12, the operation of the X-ray exposure apparatus of FIG. 10 will be described. When the shutter 207 is closed (broken line in FIG. 10), the electrons are injected by the injector 210 into the SOR ring 201 and are accelerated at step 221. At step 222, the CPU 216 instructs exposure intensity measurement to detect the X-ray intensity. In this detection process, the X-ray detector 206 is advanced into the exposure area by the X-ray detector driver 212 through the X-ray detector controller 214 (broken lines in FIG. 10), by which the X-ray intensity is detected. The detected X-ray intensity is transmitted to the CPU 216 through the signal processor 211, and the X-ray detector 206 is retracted to outside the exposure area.

At step 223, the CPU 216 calculates an X-ray intensity Ie during the exposure on the basis of the X-ray intensity detected. At step 224, the exposure time T is calculated from the set exposure amount D and the calculated level and it is set. Simultaneously, the alignment operation between the X-ray mask 208 and the wafer 209 is carried out. The exposure time T can be calculated by:

$$T = D/Ie$$

if the attenuation of the X-ray intensity is small during the exposure. Thereafter, at step 225, the CPU 216 instructs the shutter controller 215 to start the exposure operation, in response to which the shutter driver 213 opens the shutter 207 to start the exposure. When the exposure period T elapses after the start of the exposure, the shutter 207 is closed. At step 225, the discrimination is made as to whether or not the intensity detection is performed. If so, the sequence goes to 222, and if not, it goes to step 223.

The X-ray intensity Ie during the exposure is determined in consideration of the attenuation of the intensity in the following manner.

FIG. 11 is a graph showing the change of the X-ray intensity I with time t. The abscissa and ordinate represent time t and X-ray intensity I, respectively. It is assumed that the X-ray intensity is detected at the point of time tm, and the exposure operation is started at the point of time te. The X-ray intensity I(te) during the exposure is corrected in accordance with the intensity (tm) during the detection by the following equation:

$$I(te) = I(tm) \exp(-(te-tm)/\tau) \qquad (1)$$

where $\tau$ is a so-called electron beam life and can be calculated using the degree of vacuum of the apparatus and Touschek effect or the like or by measurement. "Accelerator Science", vol. 12, No. 2, P. 95, states that $\tau$ is given by:

$$\tau \text{ is } 1 \times 10^{-27} \times (1/p) \times (1/\sigma_T) \qquad (2)$$

where p is a degree of vacuum, and $\sigma_T$ is a cross-sectional area of collision.

The equation for correction may be different from equation (1). For example, when (te−tm)/$\tau$ is sufficiently smaller than 1, the correction equation, taking into account up to the first order of the Taylor expansion, is as follows:

$$I(te) = I(tm)[1-(te-tm)/\tau] \qquad (3)$$

As another example, the following equation is possible using the half-life th of the orbit electrons, as follows:

$$I(te) = I(tm)(\tfrac{1}{2})^{te-tm/th} \qquad (4)$$

For example, if the X-ray intensity of 150 mw/cm² is detected at 30 sec under the conditions that the life of the electrons is 3600 sec in the SOR ring and that the target exposure illuminance is 50 mJ/cm², the X-ray intensity Ie at the respective exposure times and the exposure period t is calculated as given in Table 1 below using the equation (1), where the transmissivity of the mask is assumed to be 50%.

TABLE 1

| TIME OF EXP. | X-RAY INTENSITY (mw/cm²) | EXP. PERIOD |
|---|---|---|
| 60 sec | 148.8 | 0.67 sec |
| 120 | 146.3 | 0.68 |
| 180 | 143.9 | 0.70 |
| 600 | 128.0 | 0.78 |

Since the X-ray intensity changes depending on the amount of injected electrons and the acceleration voltage, the X-ray intensities for the exposure operations can be determined by the equation (1) or another until the re-injection, if the X-ray intensity is detected once after the electron injection. If the detections are performed at regular intervals, for example, immediately before the respective exposure operations, the X-ray intensity during the exposure can be determined more accurately. If the number of exposure operations is to be increased, it is possible to effect the detecting operation during the wafer exchanging operation.

Figure 13:
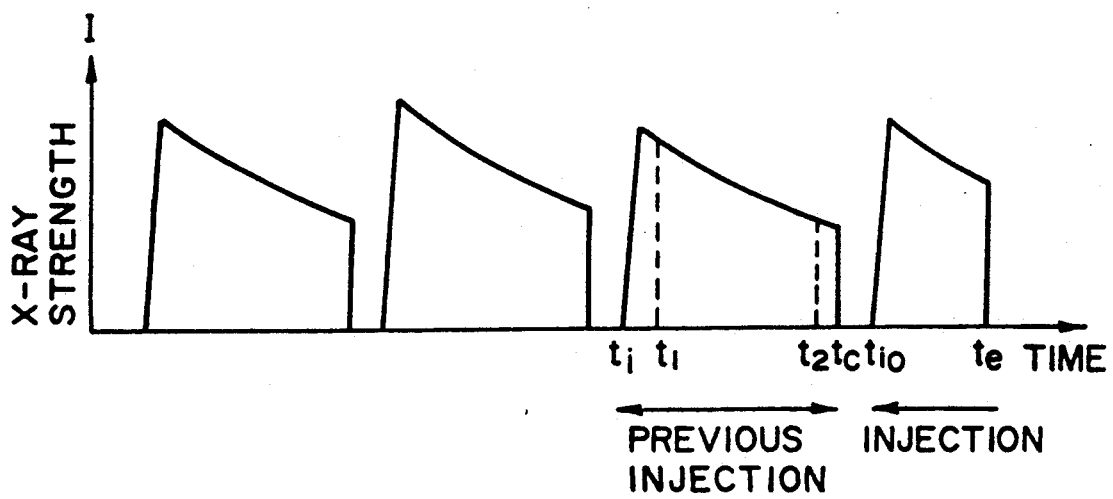
FIG. 13 is a graph showing change, with time, of the X-ray intensity I with time t.

Referring to FIG. 13, the description will be made as to determining the electron life $\tau$ on the basis of the intensity detection at the time of previous electron injection. FIG. 13 shows the changes in the X-ray intensity I with time t when the electron injection is carried out plurality of times.

The electrons are injected at the point of time ti, and the electrons are blocked at the point of time tc by which the orbit current becomes zero. The X-ray intensity is measured at the times t1 and t2, and the detected intensities are I(t1) and I(t2). The electron life $\tau$ is expressed as follows:

$$\tau = (t_2-t_1)/[\ln I(t_2)/I(t_2)] \qquad (5)$$

It is understood that the electron life is determined if the X-ray intensity is detected twice for one electron injection. However, in order to increase the accuracy of the determination of the electron life $\tau$, it is preferable that three or more detections are performed at regular intervals for one electron injection, and the electron life is determined as an average or using least square approximation. In place of the detections at regular intervals, it is possible that the intensity is detected at such intervals that the X-ray intensity attenuates by a predetermined degree from the past data, and then the electron life $\tau$ is correctly determined with a small number of detections. For example, assuming that the electron life determined on the basis of the past data is $\tau$, and the detection is performed for every 5% attenuation, the detection timing is 0.051 $\tau$, 0.105 $\tau$, 0.16 $\tau$ and 0.22 $\tau$.

Upon determination of the electron life $\tau$, not only the data at the immediately previous injection, but also other previous data may be used. If two or more detecting operations are already carried out for the current injection, the data are usable. In this case, different weights may be placed on the data depending on the difference in the points of detection times.

When the degree of vacuum is different during the intensity detection for the determination of the electron life $\tau$ than during the exposure operation, the electron life $\tau$ may be corrected using the equation (2). For example, the electron life $\tau$e is expressed, $$\tau e = (Pm.\tau m)/Pe$$

where tm and $\tau$m are a degree of vacuum and the electron life during the detection, and Pe is the degree of vacuum during the exposure.

Using the electron life $\tau$ and the detected intensity after the current injection, the X-ray intensity during the exposure period te can be determined on the basis of the equation (1).

As described above, according to the X-ray exposure apparatus according to this embodiment, the X-ray intensity during the exposure operation is predicted from the X-ray intensity detected after the orbit electrons are injected and the attenuation curve of the X-ray intensity. Therefore, when the X-ray intensity during the exposure cannot always be measured, and when the X-ray detector is advanced into the exposure area during the non-exposure-operation to detect the X-ray intensity, the X-ray intensities during the exposure operation can still be determined with high accuracy.

In addition, the difference between the detected intensity and the intensity during the exposure operation can be reduced when the attenuation of the radiation is large, or when the time interval between the X-ray intensity detection and the exposure operation is long.

Figure 14:
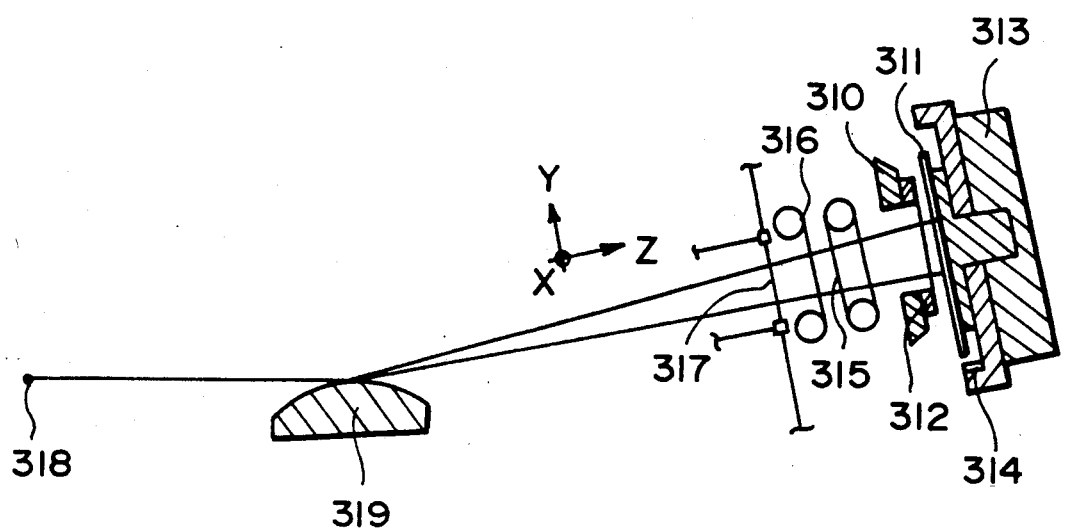
FIG. 14 is a sectional view showing the structure of the exposure system part of an exposure apparatus according to a further embodiment of the present invention.

FIG. 14 shows an exposure system of an exposure apparatus according to a further embodiment of the present invention, wherein reference numerals 311 and 312 are a wafer and a mask, respectively. The mask 312 is disposed parallel to the wafer 311 with a gap of approximately 40 microns in a z direction. The apparatus comprises a mask stage 310 for supporting the mask 312, and a wafer moving stage 313 for supporting and moving the wafer 311 along an X-Y plane. The exposure apparatus of this embodiment is a so-called stepper exposure apparatus wherein the exposure area is sequentially stepped by the wafer moving stage 313 to expose all of the exposure areas by movement of the wafer stage 313.

Figure 15:
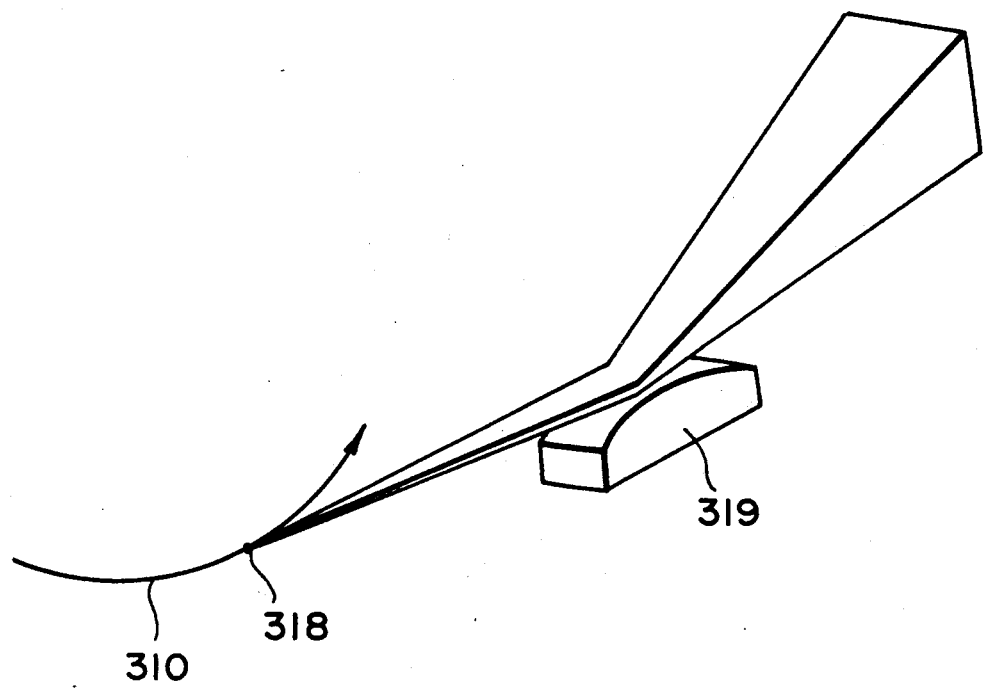
FIG. 15 is a perspective view of an illumination system with synchrotron radiation.

The apparatus comprises a sensor 314 mounted on the wafer moving stage 313 and capable of detecting intensities of the illumination radiation incident on the wafer 311 at a given point in the exposure area. A movable aperture stop 315 having an opening and an auxiliary shutter 316 constitute an exposure shutter. A beryllium thin film 317 defines a boundary between a mask side chamber containing pressure-reduced He, for example, and a radiation source side which is under ultra-high vacuum. A radiation emitting point in an SOR ring (X-ray source) is indicated by a reference number 318. The synchrotron radiation generates radiation having an intensity distribution which is uniform in a direction parallel to the plane of electron beam orbit and which is symmetrical in the vertical direction. A convex surface cylindrical mirror 319 functions, as shown in FIG. 15 schematically, to expand the synchrotron radiation in the direction (y axis direction) having the intensity distribution to illuminate the required exposure area at the position of the mask 312 and the wafer 311 in the exposure apparatus. Generally, when a cylindrical mirror having a reflection surface of single curvature is used, the illuminance intensity distribution is one-dimensional having one peak in the exposure area.

Figure 18:
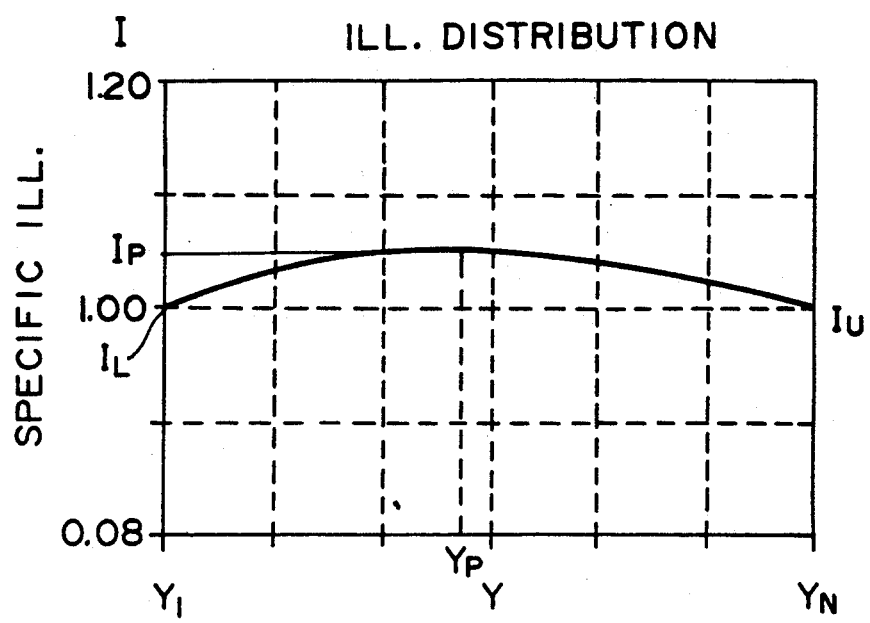
FIG. 18 is a graph showing an example of an illumination intensity distribution.

FIG. 18 shows an example of a calculated illuminance distribution weighed in consideration of the dependency on the sensitivity wavelength of the resist applied on the wafer 311.

Figure 16:
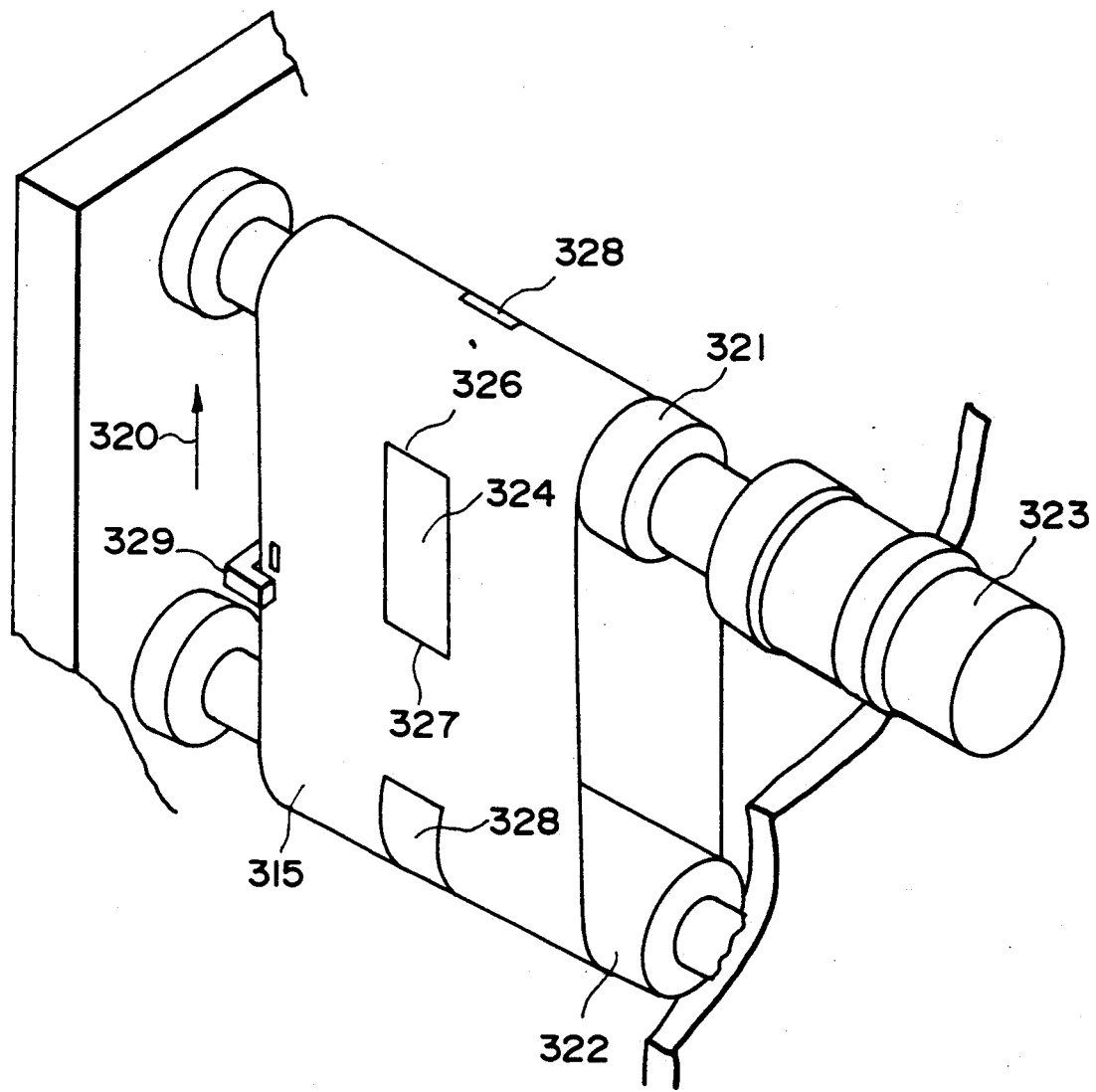
FIG. 16 is a perspective view of a movable aperture used in the embodiment of FIG. 14.

FIG. 16 shows the exposure shutter having the movable aperture stop. A belt 315 has an opening and is made of a thin plate of stainless steel, for example. The thin plate has such a thickness as to be sufficient to block the X-rays from the radiation source.

The belt 315 is stretched around rollers 321 and 322. By rotating the rollers by a driving motor 323, the opening 324 of the belt 315 functions as the movable aperture. The direction of the movement of the opening 324 is the same as the direction in which the radiation from the mirror 319 has non-uniformity in the intensity. The belt 315 has two openings 324 and 328. The opening 324 functions as the movable aperture for locally controlling the exposure time in the exposure area, and the moving speed of the leading edge 326 and the trailing edge 327 are controlled in the manner which will be described hereinafter, when the opening 324 moves through the exposure area. The opening 328 is formed so as not to block the illumination radiation when the opening 324 performs its function.

A photosensor 329 is effective to detect the position of the opening 324 to determine the timing of the opening 324 passing through the exposure area. The belt moves in the direction indicated by an arrow 320.

Figure 17:
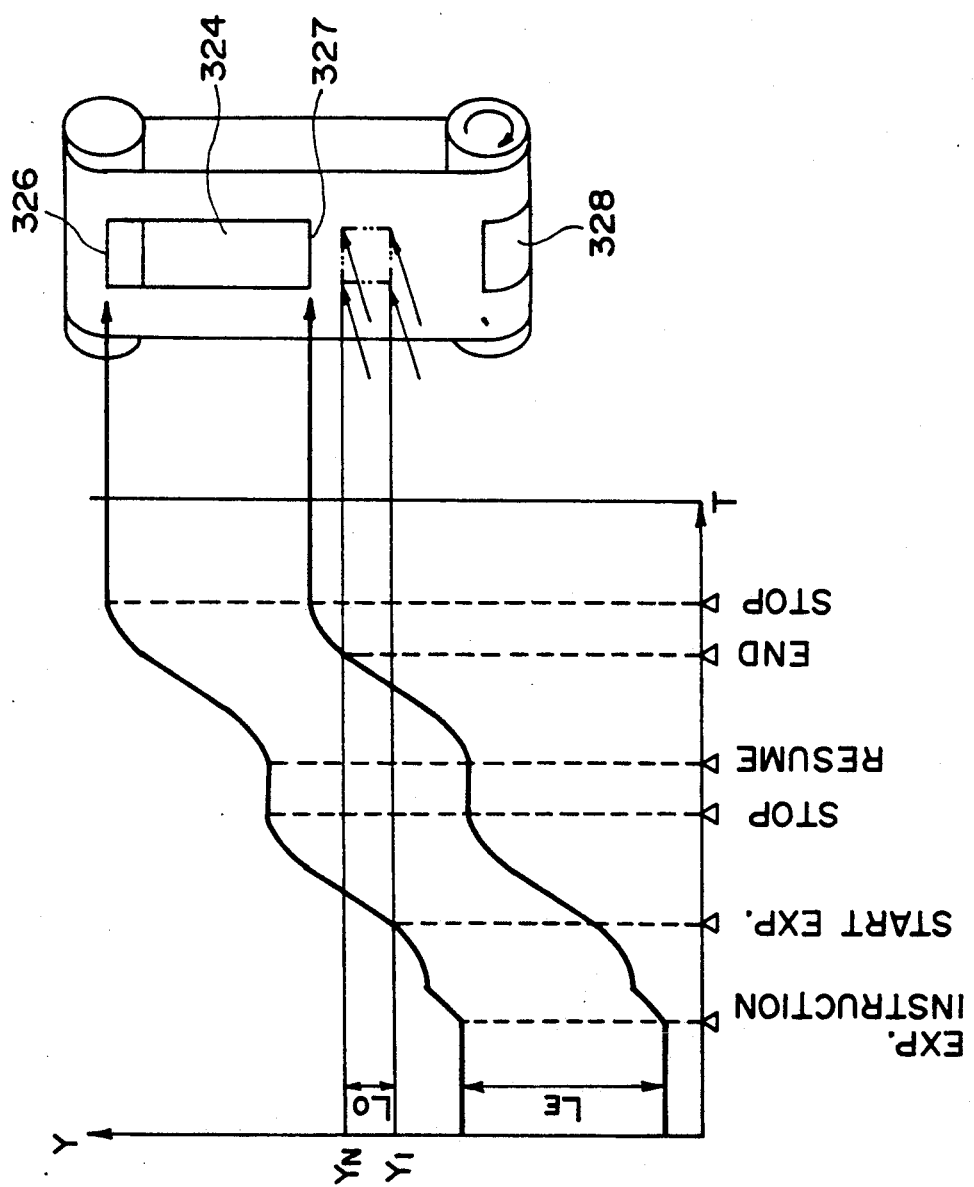
FIG. 17 illustrates movement of the movable aperture.

FIG. 17 shows an example of a profile of movement of the leading edge 326 and the trailing edge 327 of the opening 324, that is, the movable aperture. In FIG. 17, the abscissa represents time, and the ordinate represents the position of the movable aperture in the movement direction, that is, the direction (y axis direction) in which the illumination radiation has the intensity non-uniformity. The exposure area is shown by Lo. In this example, the belt 315 is controlled such that the movement speeds of the leading edge 326 and the trailing edge 327 are independently changed in the exposure area Lo.

Figure 19:
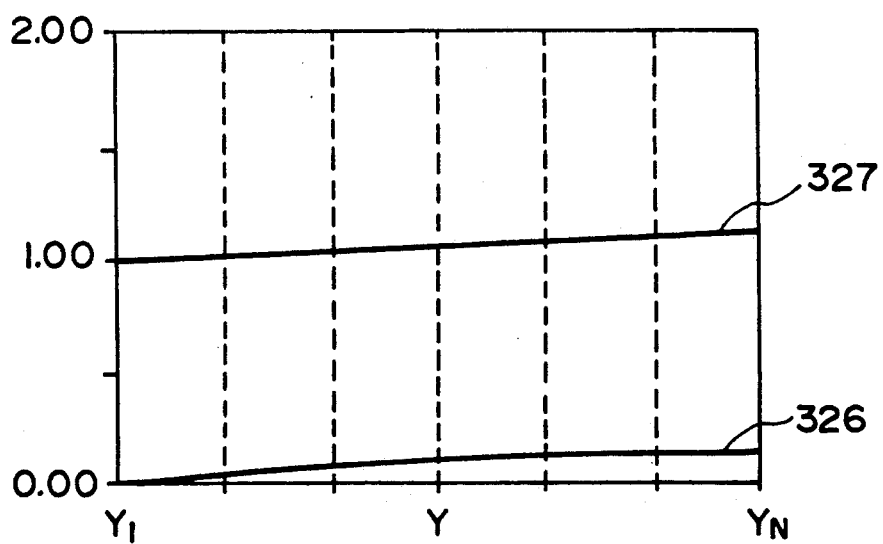
FIG. 19 is a graph illustrating movement of the movable aperture.

FIG. 19 shows a part of the FIG. 17 graph, in which the abscissa represents position, and the ordinate represents the time. In this example of operation, both the leading edge 326 and the trailing edge 327 move within the exposure area with constant acceleration. At any point in the exposure area, the difference between the point of time of the leading edge 326 passing there and the point of time of the trailing edge 327 passing there, is the exposure period at that point.

Figure 20:
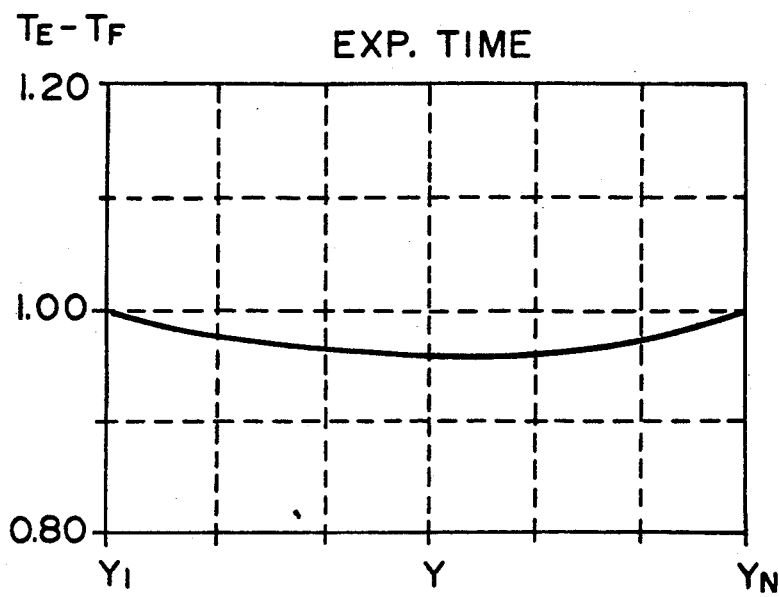
FIG. 20 is a graph showing exposure time distribution in the example of FIG. 19.

FIG. 20 shows exposure periods at various points in the exposure area, corresponding to FIG. 19.

Figure 21:
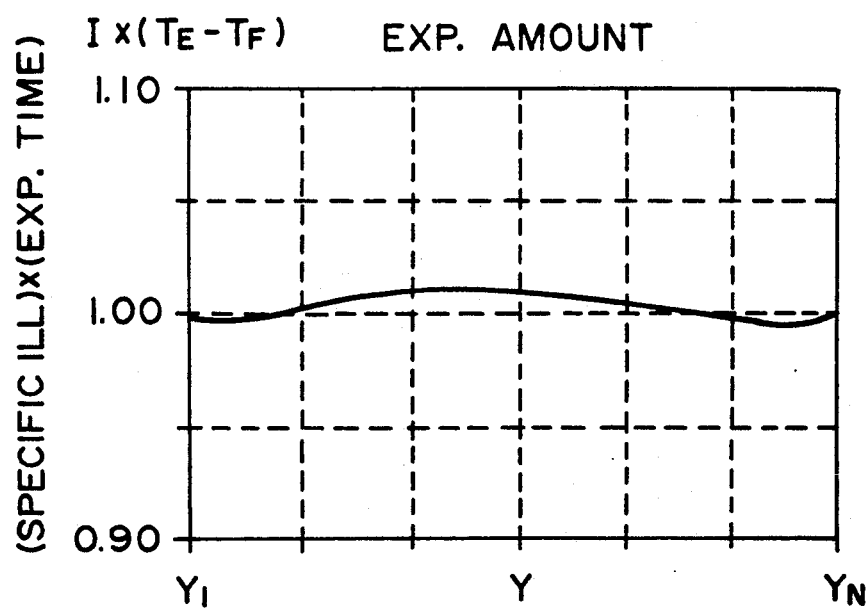
FIG. 21 is a graph showing the exposure amount distribution in the example of FIG. 19.

FIG. 21 shows a product of the intensity shown in FIG. 18 and the exposure period shown in FIG. 20, and therefore, it represents the amount of exposure in the exposure area in this embodiment. It is understood that even if the radiation source provides the radiation having the intensity shown in FIG. 18 is used, the uniform exposure amount is accomplished as shown in FIG. 21, by the movable aperture which is speed-controlled in this embodiment.

The description will be made as to the detection of the exposure illuminance and the amount of exposure in the apparatus of this embodiment.

Figure 22:
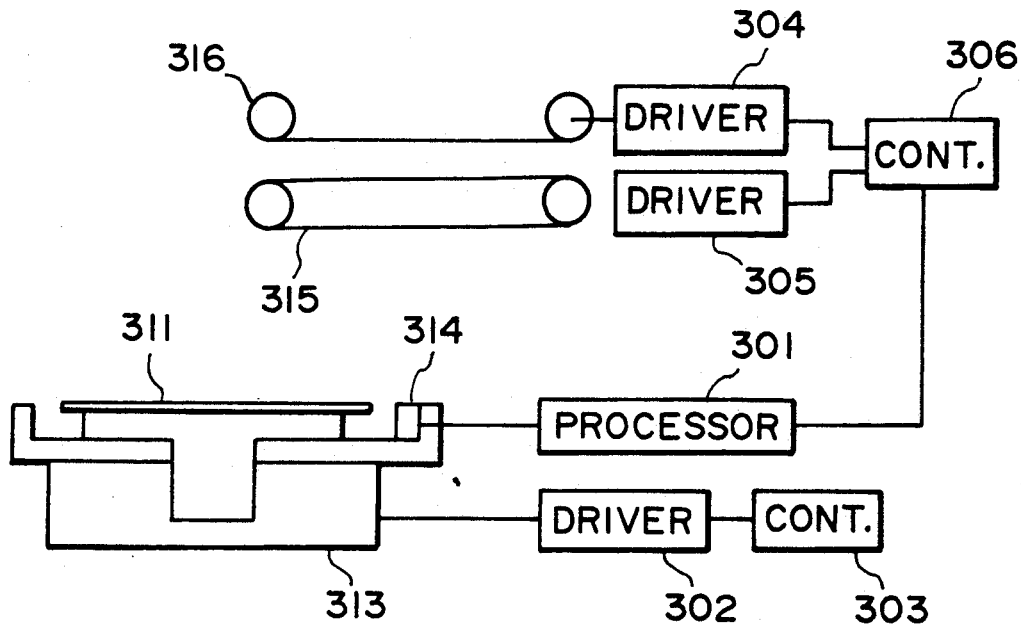

FIG. 22 shows a drive and control system for the stage and the shutter or the like. The system comprises a signal processor 301 for processing and transmitting an output of the sensor 314 to an aperture controller 306, a driver 302 for the stage 313, a stage controller 303, a driver 304 for the auxiliary shutter 106, a driver 305 for the aperture 315 and a controller 306 for the auxiliary shutter and the aperture.

For the detection of the exposure illuminance and exposure amount, the stage 313 is moved to place the illuminance measuring sensor 314 to a desired point in the exposure area, and the movable aperture 315 is moved as described in conjunction with FIGS. 17-21, by which the X-rays are projected onto the sensor 314.

Figure 23:
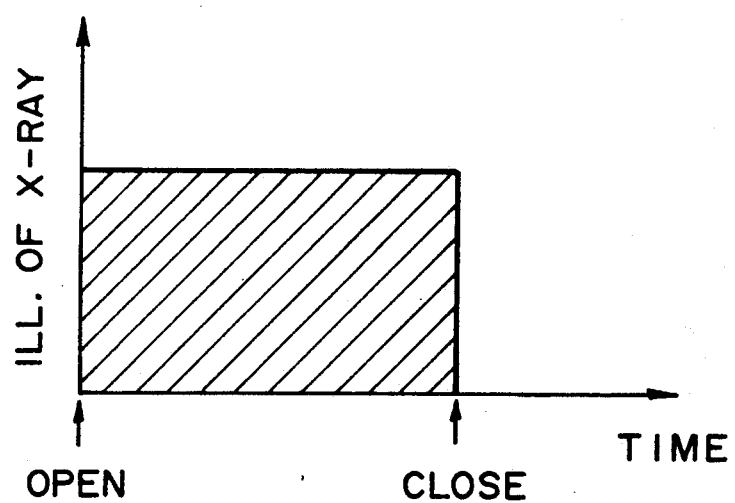
FIG. 23 is a graph showing an example of a sensor output for measuring the illuminance of the exposure radiation.

FIG. 23 shows the results of detection by the sensor 314, wherein the ordinate is an output at a certain point in the plurality of detection points, and the abscissa represents the exposure period on the basis of a reference speed determined in consideration of the sensitivity of the resist used and the target illuminance. The area of the hatched portion represents the cumulative amount of exposure. The signal processor 301 compares the amount with the preset target exposure amount (FIG. 21), and discriminates whether or not the exposure amount is proper.

The detection and discrimination are carried out at arbitrary N points in the exposure area. In this embodiment, ten point detections are performed along the y axis direction, that is, the direction in which the illuminance is not uniform. If the proper amounts of exposure are obtained at all the points, the exposure of the wafer is performed. In this embodiment, the proper exposure amount is defined as a range of the target exposure amount ±3% in consideration of the sensitivity of the resist applied on the wafer or the like. If the detection shows that there is some improper point or points, the event is fed back to the movable aperture controller 306 to modify the movable aperture speed until the proper exposure amount can be provided at all the points in the exposure area.

As described in the foregoing, according to this embodiment, the cumulative exposure amount is detected, and the result is fed back to the shutter controller, and therefore, a proper amount of exposure can be provided at all times in the exposure area.

Figure 24:
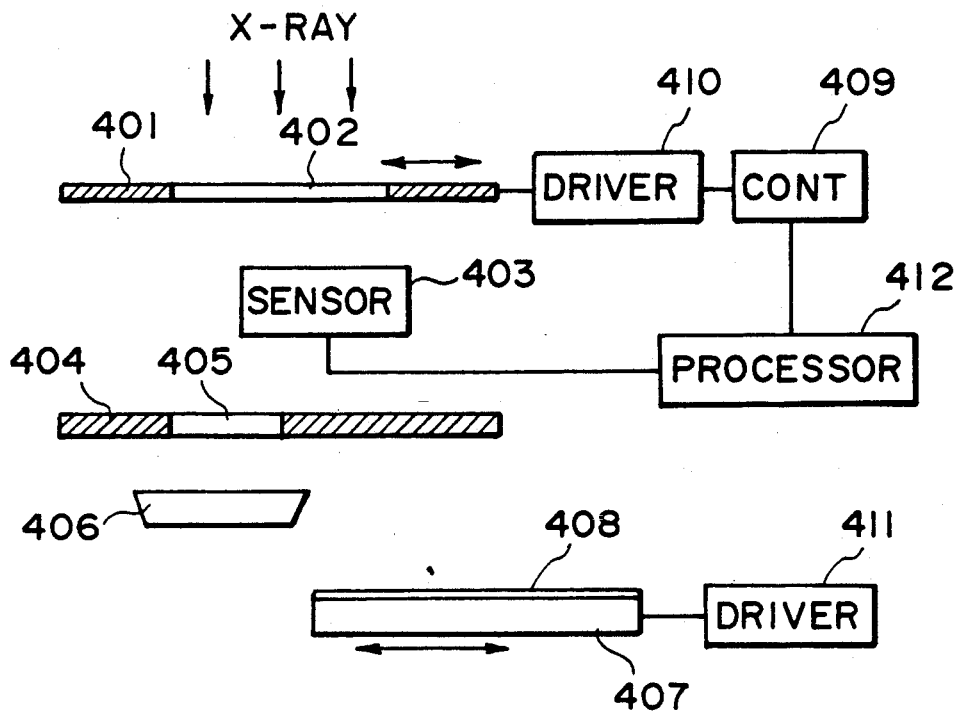
FIG. 24 is a general arrangement of an X-ray exposure apparatus according to a further embodiment of the present invention.

FIG. 24 shows an X-ray exposure apparatus according to a further embodiment of the present invention, wherein reference numerals 406 and 408 designate an X-ray exposure mask and a wafer, respectively. The apparatus comprises a shutter 401 provided with an opening 402, an X-ray sensor 403, an aperture 404 for defining the exposure area provided with an opening 406, a wafer stage 407, a shutter controller 409, a shutter driver 410, a wafer stage driver 411, and a signal processor 412 for reading an output from the sensor. The signal processor 412 includes an amplifier, a filter and a rectifying circuit and others.

When the illuminance of the X-ray is detected, the stage 407 is moved to outside the opening 405 of the aperture stop 404 so that the wafer 408 on the wafer stage 407 is not exposed to the X-rays. Subsequently, the shutter 401 is displaced leftwardly and rightwardly so as to expose the sensor 403 pulsewisely to the X-rays.

By this, a pulsewise current is produced from the sensor 403. The signal processor 412 reads the sensor output in timed relation with opening and closing of the shutter 401, so that the output when the shutter 401 is opened and the output when the shutter is closed are alternately read. From the difference therebetween, an AC component of the pulse current can be obtained, by which a correct X-ray intensity can be determined with the dark current variation removed.

In view of the fact that the shutter 401 is for the exposure operation, an example of detection when the high speed reciprocal movement is difficult. The structure is the same as shown in FIG. 24.

Figure 25:
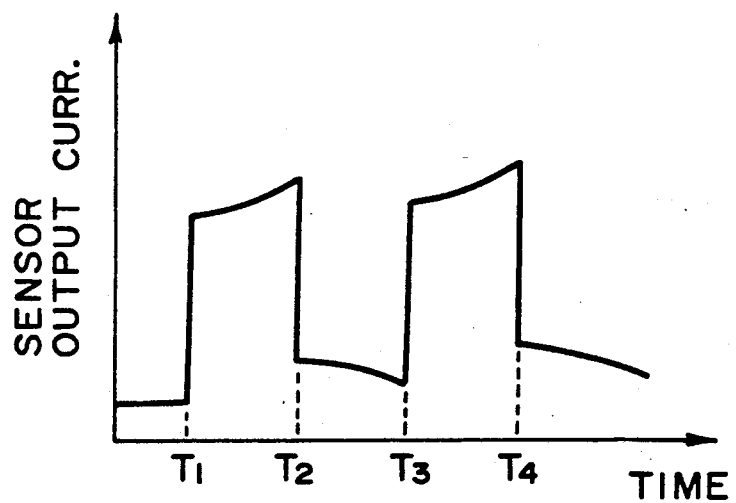
FIG. 25 is a graph of a sensor output current with time in the embodiment of FIG. 24.

FIG. 25 shows sensor output current vs. time in the modified embodiment. In this Figure, the shutter 401 is opened at the times T1 and T3, and it is closed at times T2 and T4.

In the illuminance determining operation in this embodiment, the output current of the sensor 403 is detected immediately before the shutter 401 is opened at the time T1, and the detection is stored as I1.

Then, the shutter 401 is opened at time T1, and immediately, the output current of the sensor 403 is read and stored as I2. The difference between the output current I2 and the output current I1 gives an output current component corresponding to the X-ray intensity. In this manner, the correct X-ray intensity can be obtained.

In order to further enhance the detection accuracy in this embodiment, the sensor output current I3 is again detected at time T2 when the shutter 401 is opened, and is stored. Thereafter, the shutter 401 is immediately closed, and immediately thereafter, the sensor output current I4 is detected. The difference between the output current I3 and the output current I4 similarly gives a correct output current component corresponding to the X-ray intensity.

In FIG. 25, the difference in the output current of the sensor 403 before and after the opening and closing time of the shutter 401, T1, T2, T3 and T4, and an average thereof is determined, so that the detection accuracy is further improved.

Figure 26:
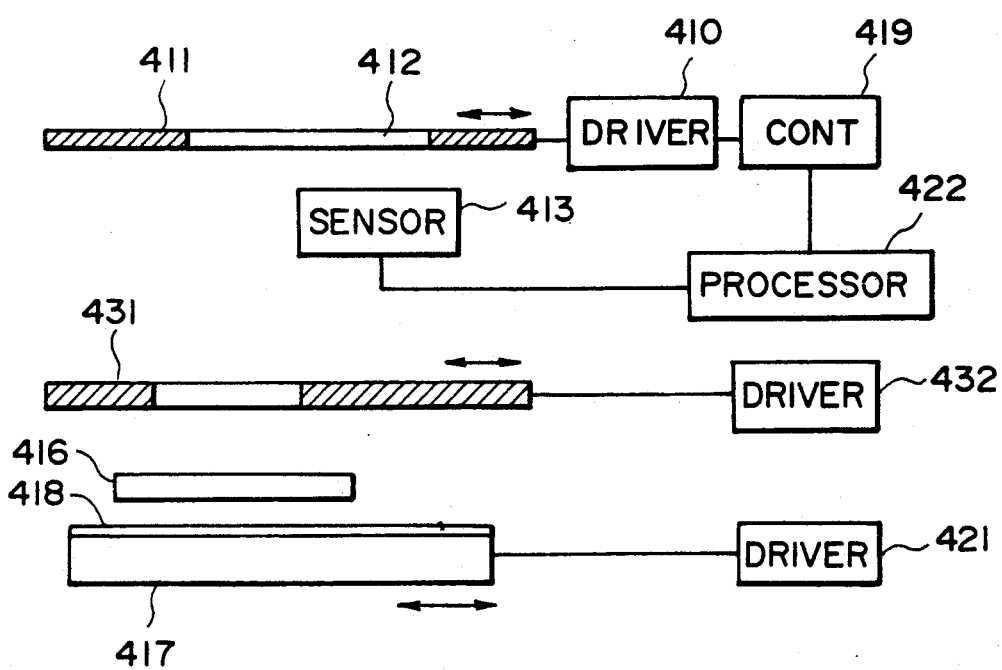
FIG. 26 is a general arrangement of an X-ray exposure apparatus according to the FIG. 24 embodiment with a modification using an auxiliary shutter.

FIG. 26 shows a modification of the FIG. 24 embodiment. In this embodiment, the exposure area defining aperture 404 of the FIG. 24 embodiment is replaced with an auxiliary shutter. In FIG. 26, the auxiliary shutter 431 functions to confine the exposure and to control the exposure/non-exposure. The auxiliary shutter 431 is driven by a driver 432. This embodiment is similar to the FIG. 24 embodiment in the other respects, and therefore, the detailed description is omitted by assigning the same reference numerals as in FIG. 24 to the elements having the corresponding functions.

When the illuminance is to be detected, the auxiliary shutter 431 is closed to prevent the wafer 408 from being exposed to the X-rays. The illuminance detecting system is similar to that of the FIG. 24 embodiment.

In this embodiment, the detection error due to the dark current of the semiconductor sensor can be corrected by using the exposure shutter, and therefore, the exposure illuminance can be determined with high accuracy without increasing the mechanism in the apparatus.

Figure 27:
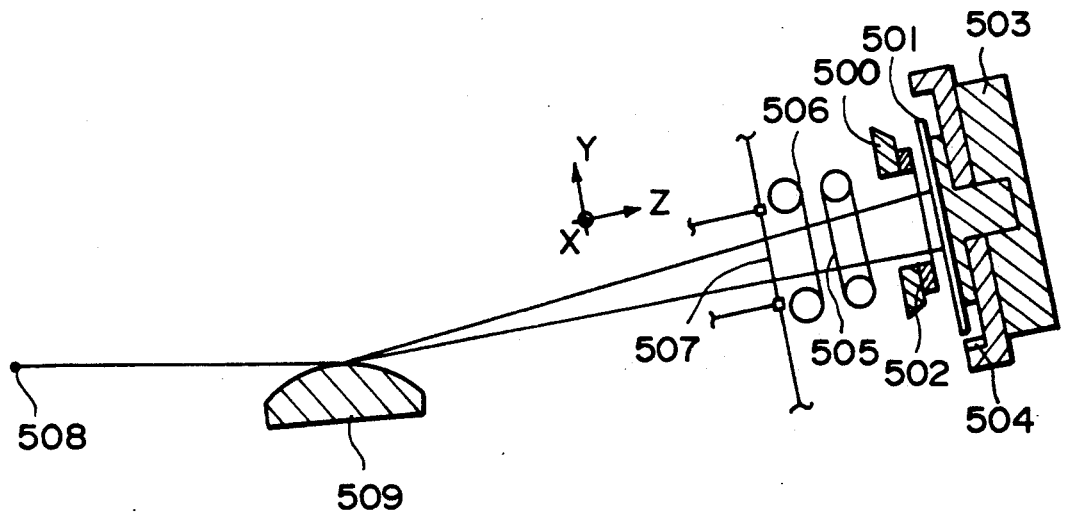
FIG. 27 shows an exposure apparatus to which the present invention is applicable.

FIG. 27 shows an exposure apparatus to which a further embodiment of the present invention is applicable, wherein reference numerals 501 and 502 designate a wafer and a mask, respectively, wherein the mask is disposed parallel to the wafer 501 with a gap of approximately 40 microns in a z direction. The apparatus comprises a mask stage 500 for supporting the mask 502, and a wafer moving space 503 for supporting and moving the wafer 501. In this embodiment, the exposure apparatus is a so-called stepper exposure apparatus wherein the exposure areas sequentially stepped to expose all of the exposure areas of the wafer are exposed. The apparatus further comprises a sensor 504 mounted on the wafer moving stage 503 to detect the intensity of the illuminating radiation incident on the wafer 501 at a given point in the exposure area. A movable aperture stop 505 has an opening to constitute an exposure shutter together with an auxiliary shutter 506. Designated by a reference 507 is a thin film of beryllium. The space between the thin film 507 and the mask 502 contains pressure-reduced helium, and the space between the mask 502 and the radiation source is an ultra-high vacuum space. A radiation emitting point of the SOR ring which is an X-ray source is designated by a reference 508.

The intensity of the synchrotron radiation is uniform in a direction parallel to a plane including the orbit of the electron beam, but the intensity is not uniform in the vertical direction, and is symmetrical. A convex cylindrical mirror 509 functions to expand the synchrotron radiation in the direction in which the radiation has the intensity distribution (y axis direction), so that the radiation can illuminate the exposure area required at the position of the mask 502 and the wafer 501 in the exposure apparatus. Generally, when a cylindrical mirror having a refraction surface of a single curvature is used, the illuminance intensity is a one-dimensional distribution having one peak in the exposure area.

Figure 28:
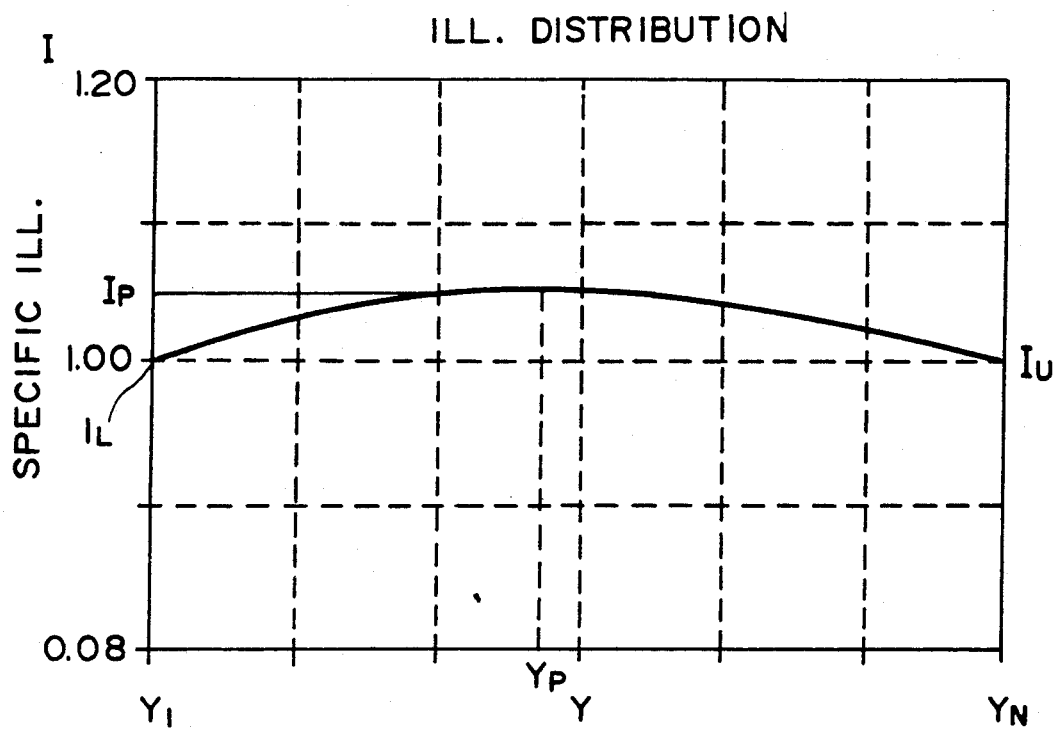
FIG. 28 is a graph showing an illuminance distribution in the direction of the y axis on the surface to be illuminated on an optical axis of the synchrotron radiation.

FIG. 28 shows an example of a calculated illuminance distribution weighed in consideration of the dependency, on the wavelength of the sensitivity of the resist applied on the wafer 501.

Figure 29:
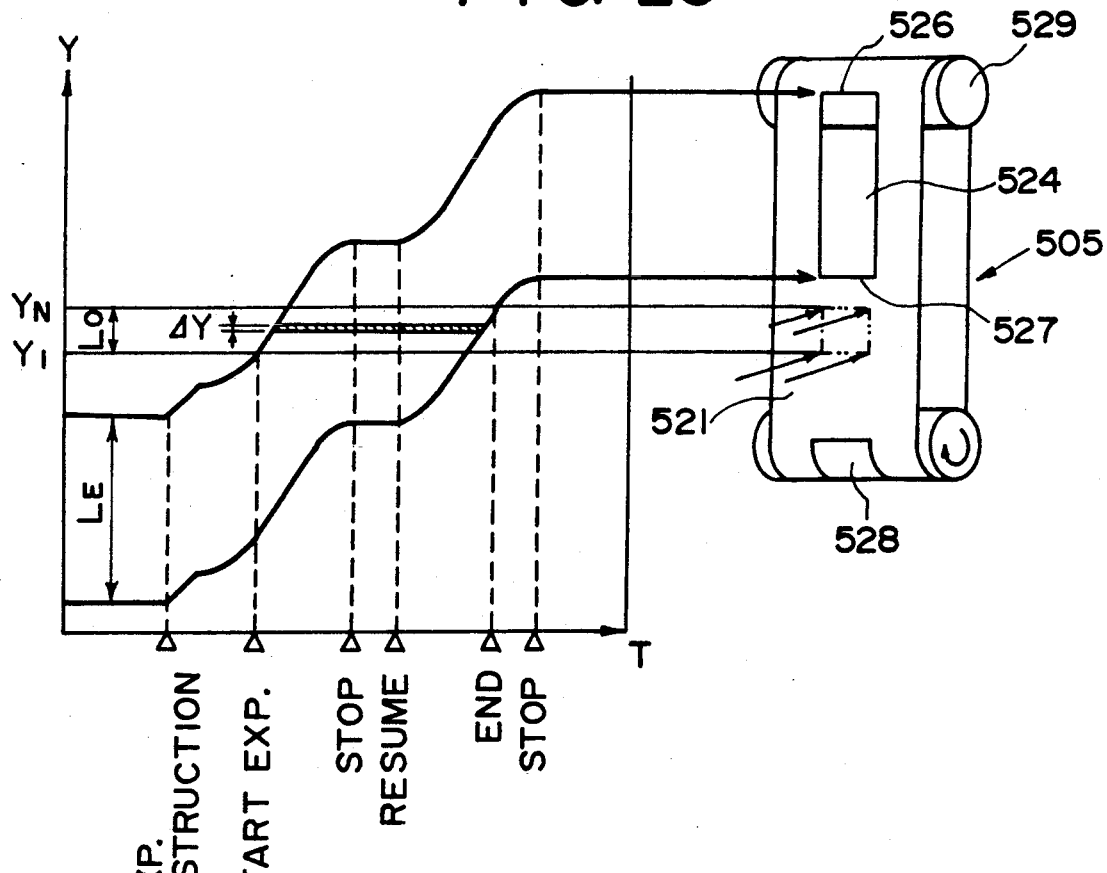
FIG. 29 shows a driving profile for the shutter used in the FIG. 27 apparatus.

FIG. 29 schematically shows the appearance of the exposure shutter 505 and a driving profile. A belt 521 is stretched between the drums 528 and 529 and is made of stainless steel, for example, and the thickness is sufficient to block the X-rays. The aperture 524 is defined by a leading edge 526 and the trailing edge 527. The time period between the passage of the leading edge 526 at the view angle (exposure start) and the passage of the trailing edge 527 at the view angle (exposure end) is the time period of exposure. In the belt 521, another opening is formed so as not to block the exposure through the aperture 524 in the view angle. In the drive profile of the shutter 505 (in the graph of FIG. 29) the area between Y1–YN corresponds to the view angle to be exposed. In this region, an area of a small region ΔY defined by the leading edge 526 and the trailing edge 527 is an amount of exposure at a point in the view angle. The amount of exposure at each of such points, can be controlled one-dimensionally by moving the movable aperture 524 in a driving profile. In this example, the driving profile is so selected that the illuminance distribution of FIG. 28 is made uniform, The intensity attenuation of the radiation provided by the synchrotron radiation source is logarithmic from the time of electron injection from a linear accelerator, as shown in FIG. 32. Therefore, it is preferable that the driving profile of the exposure shutter is changed for each of the exposure operations on the basis of the intensity detection from the radiation source, so that the desired amount of exposure can be provided for each of the shot areas.

In order to ease the correction operation, the intensity of the synchrotron radiation is detected by a detector 504 (FIG. 27) in this embodiment. In response to the detected intensity, the driving profile is expanded or contracted in the direction of the time axis, thus providing the desired exposure amount.

Figure 30:
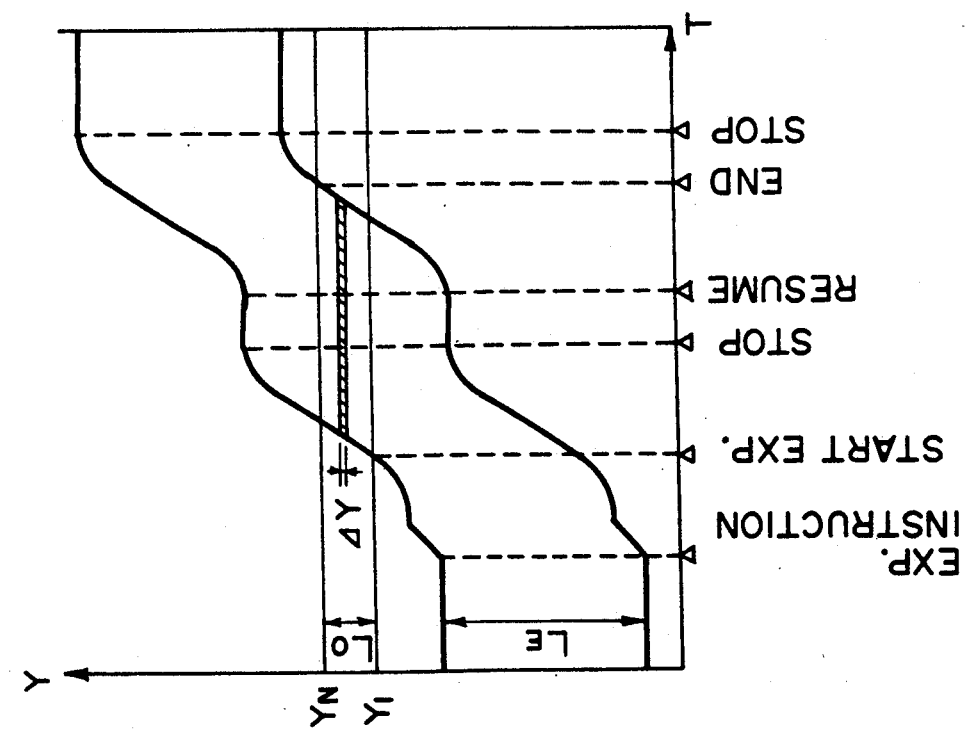
FIGS. 30 and 31 show driving profiles in which the time axis is expanded or contracted in accordance with an embodiment of the present invention.
Figure 31:
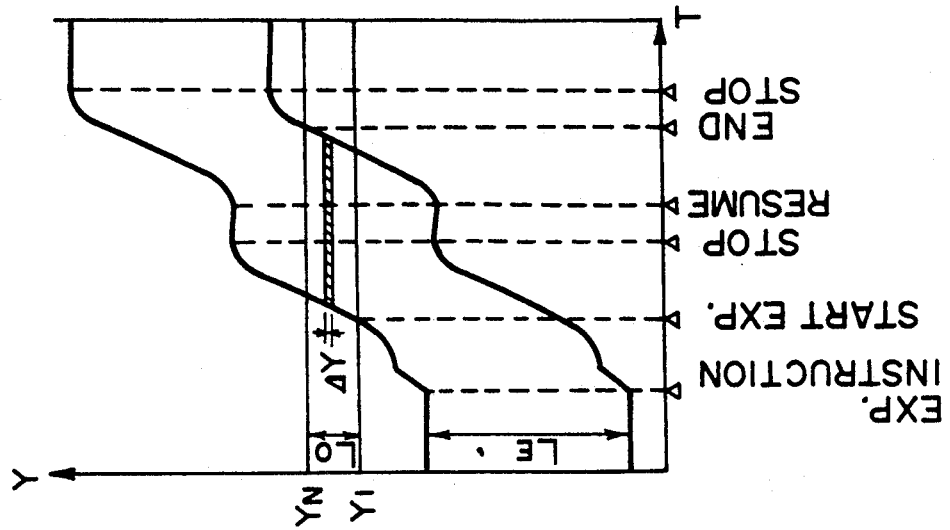

FIGS. 30 and 31 show an example. FIG. 31 shows an expanded driving profile provided by expanding the FIG. 29 driving profile only in the direction of the time axis (abscissa). This is applicable when the intensity of the synchrotron radiation by the radiation source is low. FIG. 31 shows the opposite case.

Figure 36:
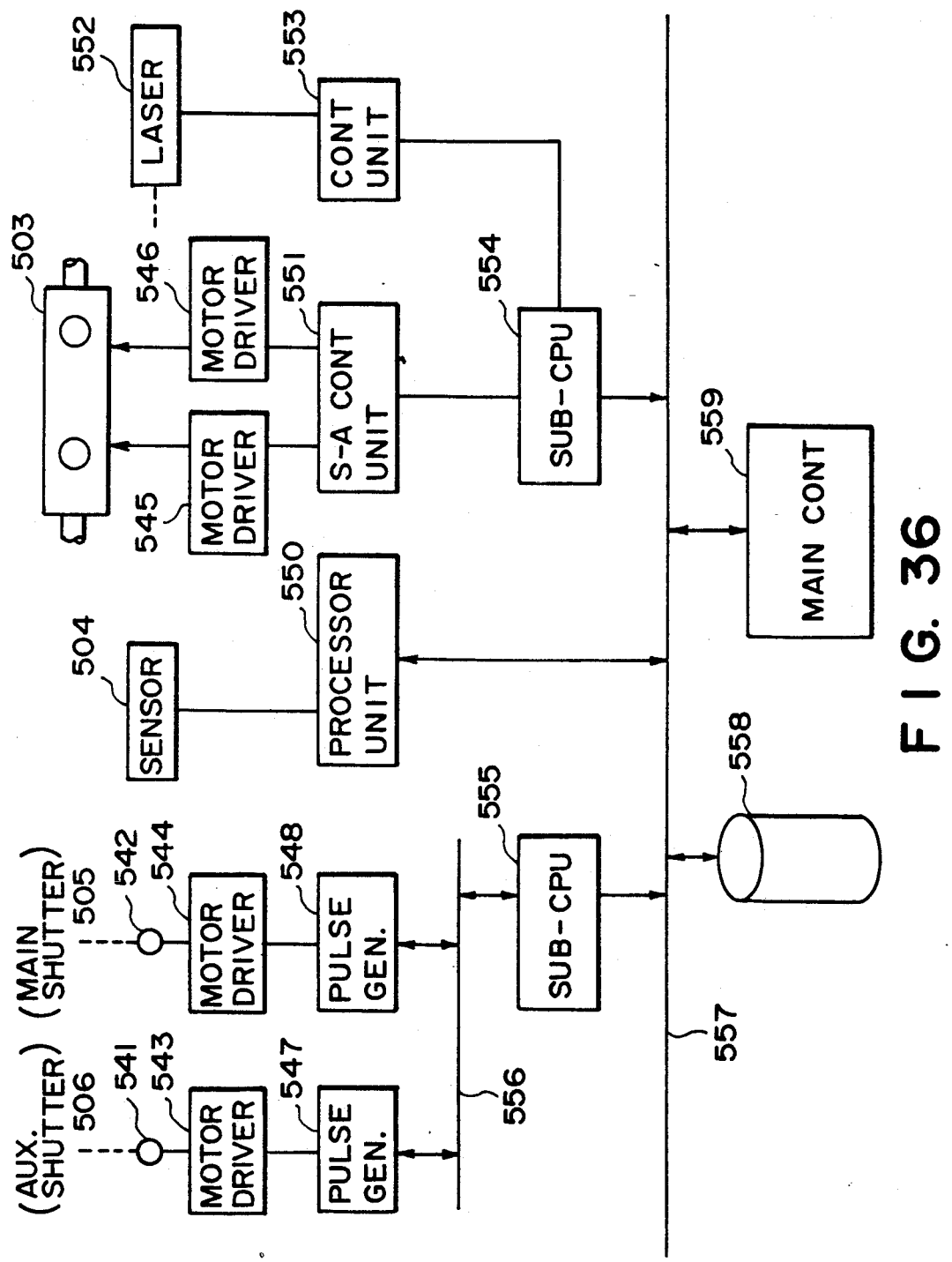
FIG. 36 shows a system structure of an apparatus according to a further embodiment of the present invention.

FIG. 36 shows a system structure for accomplishing the above function. The system comprises driving motors 541 and 542 for driving the auxiliary shutter 506 and the main shutter 505 of FIG. 27. The motors 541 and 542 are pulse motors or DC motors driven by motor drivers 543 and 544, respectively. Pulse generators 547 and 548 supply pulses to the motor driver 543 and 544, and in response to each of the pulses, the motor 541 or 542 is rotated by a predetermined angle accurately. The pulse generators 547 and 548 are provided with a RAM which stores a table shown in FIG. 37, for example. The contents of the table correspond to the pulse intervals produced from the pulse generators 547 and 548. A subordinate CPU (central processing unit) 550 controls the main shutter 505 and the auxiliary shutter 506 and controls the pulse generators 547 and 548 through a local bus line 556.

A signal from the sensor 504 for the illuminance detection mounted on the stage 507 shown in FIG. 28 is converted into a digital signal by a detector signal processing unit 550.

The stage 503 is driven by a driving motor which is driven by a motor driver 545, and the positioning of the stage 503 is effected by a motor driver 546. A stage actuator controlling unit 551 controls the position of the stage 503. Designated by reference numerals 552 and 553 are a laser interferometer and a control unit for distance measurement, respectively. Those elements are effective to correctly measure the position of the wafer 501 carried on the wafer stage 503. The stage controlling unit 551 and the controlling unit 553 for the distance measuring system are controlled by the subordinate CPU 554. To a common bus 557, a detector signal processing unit 550 and the subordinate CPU 554 for the stage side are connected, and therefore, the illuminance of the exposure radiation can be effected at any point in the exposure area synchronously, and the detection can be stored in the memory 558 for the respective points in the exposure area by the instructions by the main controller 559.

During the actual exposure operation (during the operation for transferring the pattern of the mask 502 to the wafer 501), a shutter driving table (FIG. 37) for providing the desired exposure distribution from the contents stored in the memory 558, and the table data are supplied to the RAM of the pulse generators 547 and 548, and they drive the associated motors. Immediately before the shot exposure, the illuminance is detected by the sensor 504, and if the radiation intensity of the illumination source attenuates as compared with the previous shot, for example, the driving table of FIG. 37 is corrected mathematically by the main controller 559. The driving profile 29 is modified by changing the pulse intervals of the pulse generators 547 and 548 so as to provide the desired proper exposure amount distribution. The driving table first produced is stored as a source table together with the data of the illuminance of the exposure radiation when the data are obtained.

Figure 35:
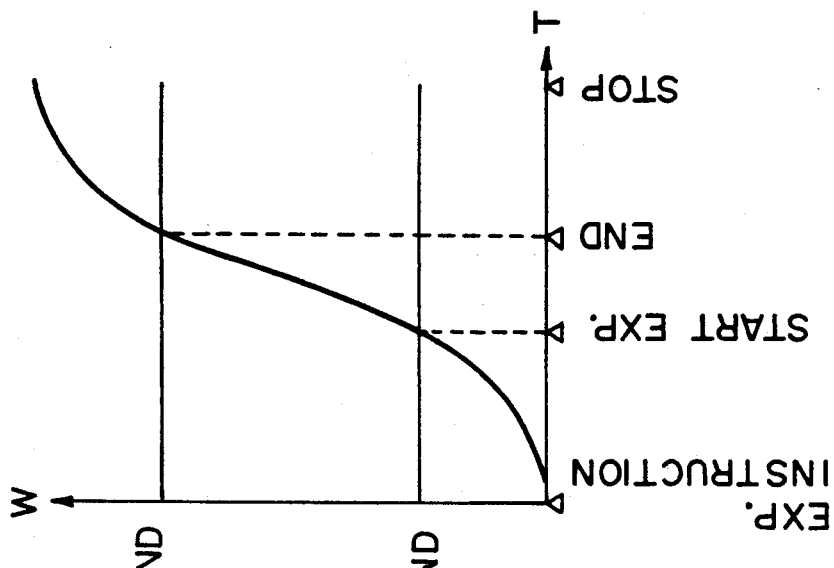
FIGS. 34 and 35 show driving profiles for the mirror in which the time axis is expanded or contracted in accordance with the present invention.
Figure 34:
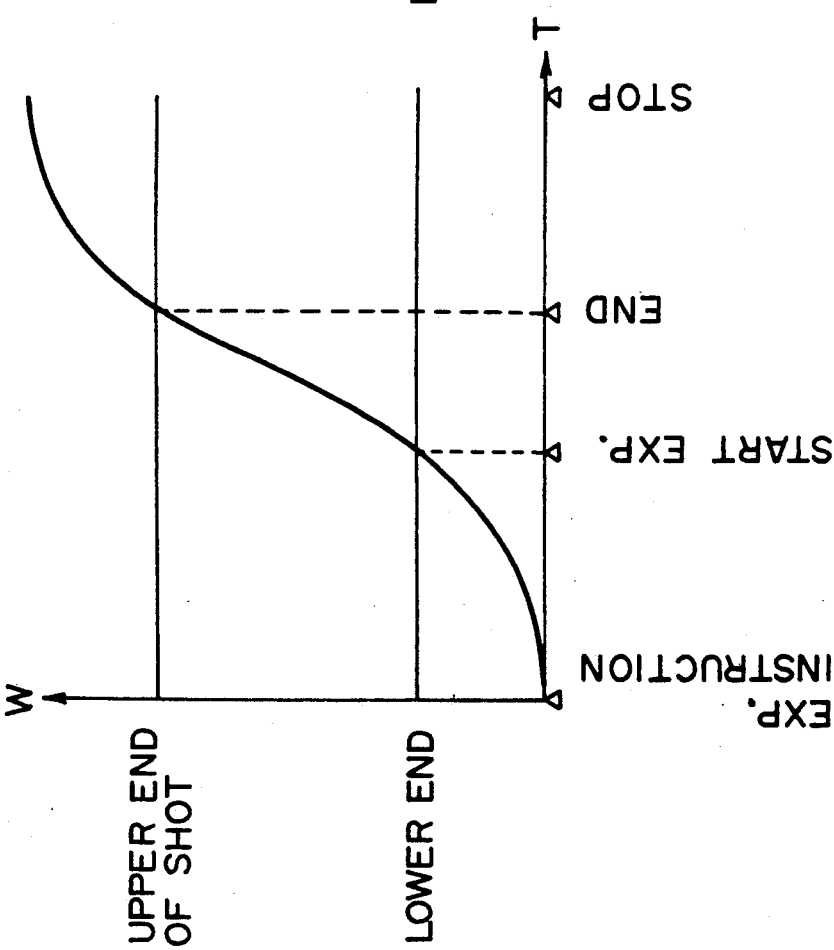

FIG. 33 shows another structure of the exposure apparatus to which an embodiment of the present invention is applicable. Since this embodiment is similar to the FIG. 27 embodiment, the same reference numerals as in FIG. 27 are assigned to the elements having the corresponding functions, and the description thereof are omitted for simplicity. The FIG. 27 exposure apparatus uses a movable aperture 505 to limit the exposure amount, but in the apparatus of this embodiment, the mirror 509 is swung to control the exposure amount. The mirror 509 expands the SOR in the direction of the Y axis to illuminate a part of the mask 502 and a part of the wafer 501. The mirror 509 is swung by an actuator mechanism 531. The actuator mechanism 531 swings the mirror 509 in the direction y and in the direction Wx (x axis rotational direction). By this, the reflected radiation is deflected in the y direction, and therefore, the entire area of the mask 502 is illuminated by the exposure radiation. However, the spectral distribution and the intensity of the deflected radiation are different depending on the angle of incidence of the synchrotron radiation from the radiation source, and therefore, the exposure amount distribution is not uniform if the scanning is at a constant speed in the Y direction. To obviate this problem, a mirror swinging profile as shown in FIG. 34 is produced, and in accordance with this profile, the mirror 509 is swung to avoid the non-uniformity of the exposure. When the radiation source intensity changes similar to the case of FIG. 27, the profile is expanded or contracted in the direction of the time axis as shown in FIG. 35 so as to provide a desired exposure amount. In FIG. 35, an increase of the intensity of the radiation by the radiation source is compensated for by contraction of the time axis of the profile, thus providing a desired amount of exposure.

The system arrangement of the FIG. 33 embodiment is similar to the FIG. 27 embodiment. However, in FIG. 36, the mechanical structures of the actuators 541 and 542 and the motor drivers 543 and 544 are modified to swing the mirror 509 in FIG. 33. According to this embodiment, the necessity for producing the driving profile for driving the exposure amount controlling device of the exposure apparatus for each of the exposure shots is avoided, and simply by expanding and contracting the time axis of the profile once produced, the proper exposure distribution can be provided at all times quickly in response to the intensity change of the radiation by the radiation source. Therefore, the calculation process for repeatedly producing the profile has been greatly simplified.

Figure 38:
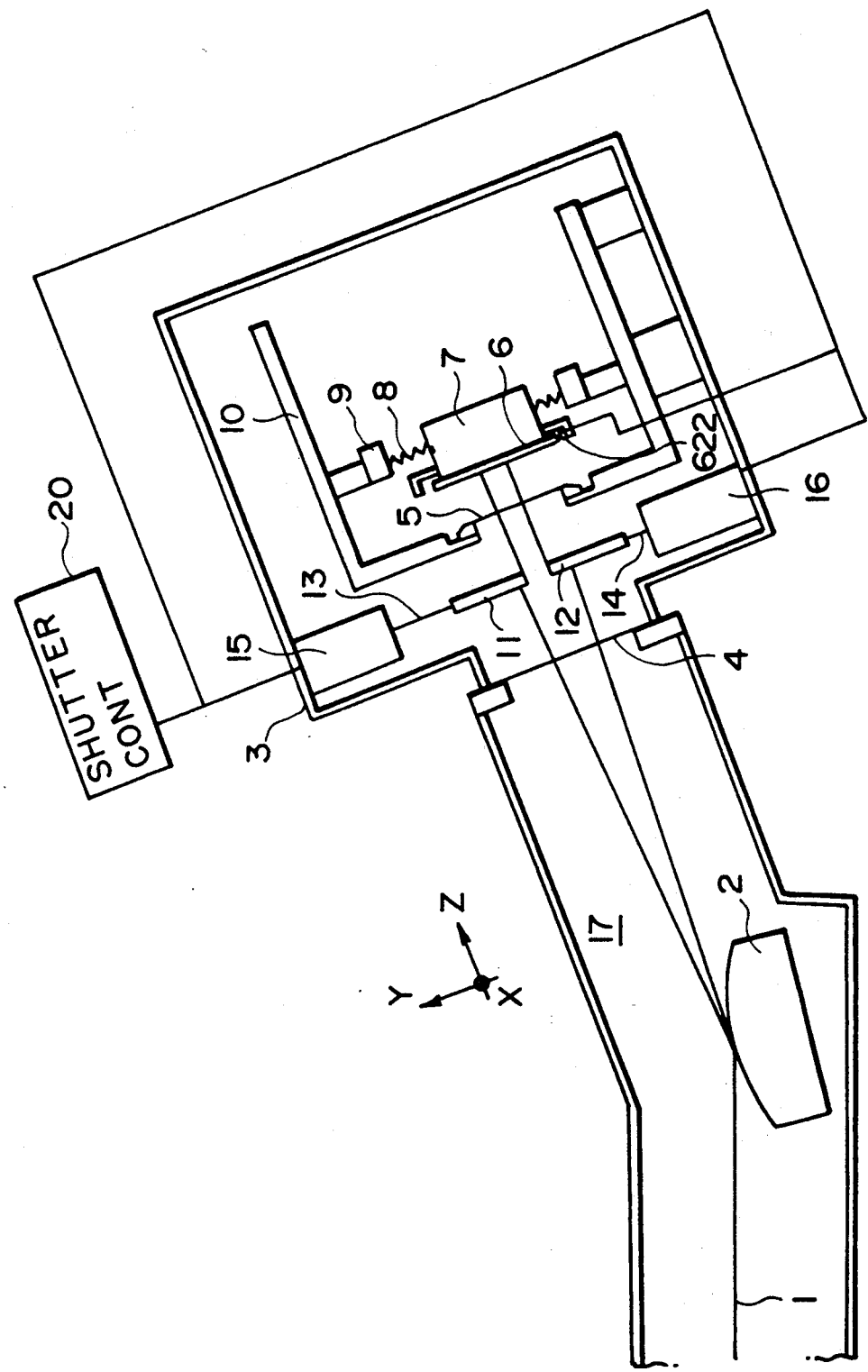
FIG. 38 is a general arrangement of an exposure apparatus according to a further embodiment of the present invention.

FIG. 38 shows a further embodiment. In this Figure, the same reference numerals as in FIG. 1 are assigned to the elements having the corresponding functions, and the detailed description of those elements are omitted for simplicity.

In the present embodiment, the stage 7 is provided with an X-ray detector 622. Before the exposure operation, the wafer stage 7 is moved in the direction of the y axis to detect the change of the beam intensity of the synchrotron radiation with time. The intensity of the synchrotron radiation attenuates with time. The change of the beam intensity I with time is expressed as follows:

$$I = I_0 e^{-t/\tau}$$

where Io is an initial beam intensity.

The detector 622 detects the beam intensity of the synchrotron radiation for a necessary period of time, and the shutter controller determines a time constant $\tau$ (generally called an "electron life") of the attenuation using least square approximation. The time constant $\tau$ of the attenuation may be the one determined beforehand. If the attenuation characteristics are determined in this manner, the beam intensity of the synchrotron radiation can be calculated at any point of time.

As an example, assuming that the time constant of the beam attenuation is 7600 sec, and that the beam intensity I at time T1 is 1 mW/cm² by calculation, and that the necessary amount of exposure Q is 120 mJ/cm², the proper exposure period is $$I \int_{T1}^{T2} e^{-t/\tau} dt = Q$$

Figure 39:
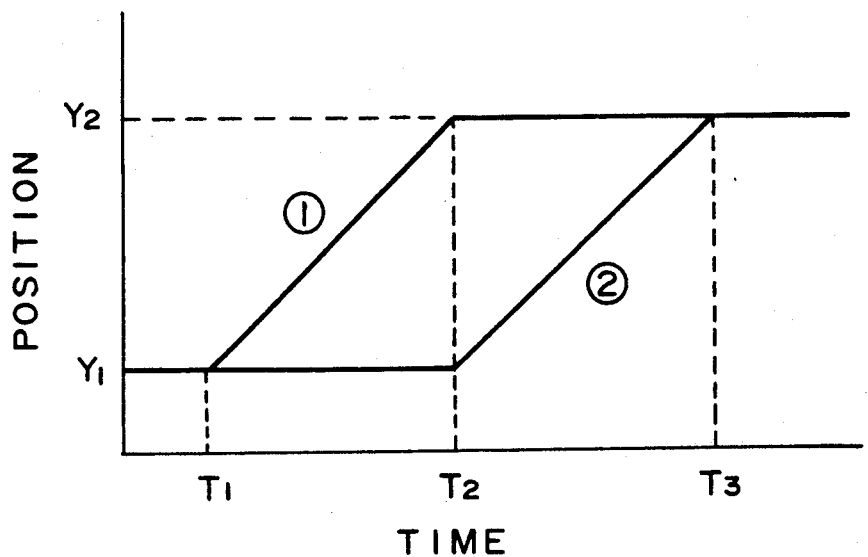
FIG. 39 shows a shutter driving curve according to an embodiment of the present invention.

The result is Q=121 sec. The calculation is performed by the shutter controller 20. As shown in FIG. 39, the aperture limiting or defining member 11 of the movable aperture stop 1 is driven by the driver 15 for 121 sec from the time T1 to the time T2 at a speed of (Y2-Y1)/121 in the direction +Y, and thereafter, it is stopped.

Figure 3:
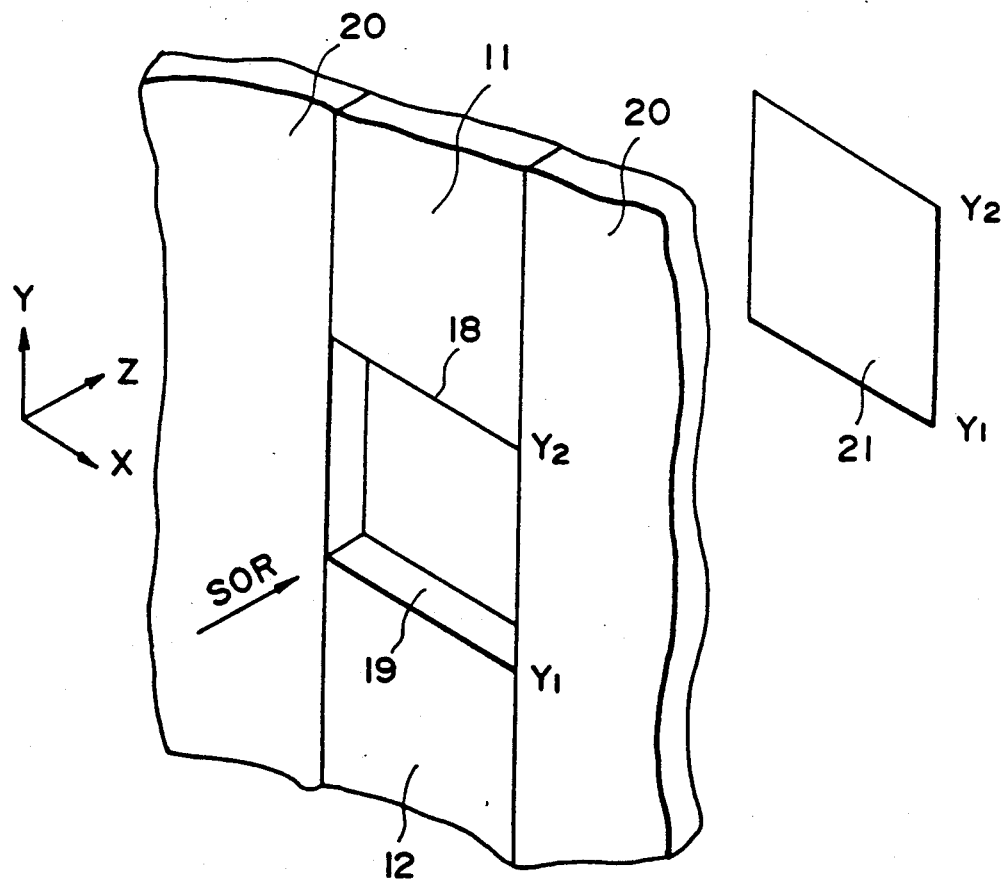
FIG. 3 is a perspective view of a shutter of the FIG. 1 apparatus.
Figure 4:
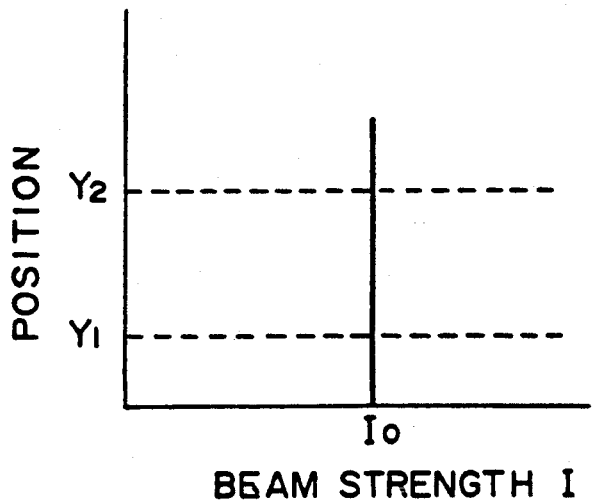
FIG. 4 is a graph showing an example of a beam intensity distribution.
Figure 5:
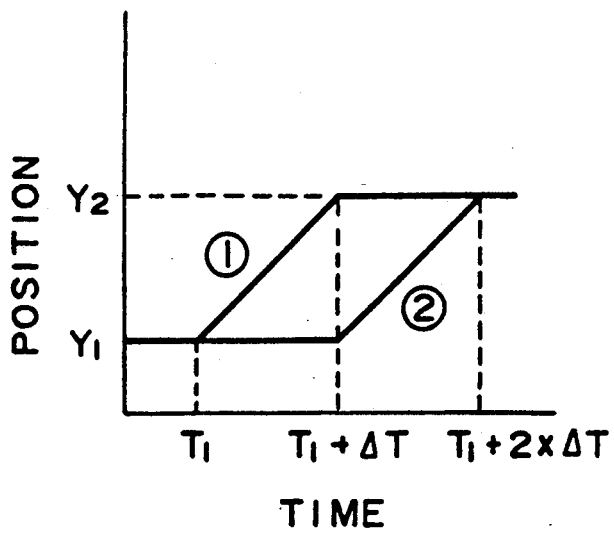
FIG. 5 shows a shutter driving profile of the apparatus of FIG. 1.

In FIG. 39, (1) shows a relationship between a position of an edge surface 18 (FIG. 3) of the opening limiting member 11 of the movable aperture and the time. The opening limiting member 12 of the movable aperture stop is moved from the time T2 in the direction +Y by the driver 16. As to the driving speed at this time, the shutter controller calculates the driving speed of the edge surface 19 to provide a uniform amount of exposure within the angle of view 21 by the following equation:

$$\int_{T1}^{T2 + Y/v} e^{-t/\tau} dt = \int_{-t_2}^{t} e^{-t/\tau} dt$$

Where Y is a position of the edge surface 19 (FIG. 3) of the opening limiting member 12 of the movable aperture stop at the time t.

The speed v at which the limiting member 11 of the movable aperture stop moves in the direction +Y is:

$$(Y2-Y1)/(T2-T1)$$

The limiting member 12 of the movable aperture stop is moved from the time T2 at the following speed:

$$v.e^{-t/\tau}/(e^{-t/\tau}+1-e^{-T2/\tau})$$

where $\tau$ is a timing constant of the beam attenuation.

This movement is in the direction +Y, and when it reaches the position Y2, an opening limiting member 12 is stopped. In FIG. 39, (2) shows a relationship between a position of the edge surface 19 of the opening limiting member 12 of the movable aperture and the time.

By driving the movable aperture stop in this manner, the exposure amount within the view angle 21 is substantially uniformly 120 mJ/cm², so that the mask pattern can be transferred onto the wafer with high resolution.

Figure 40:
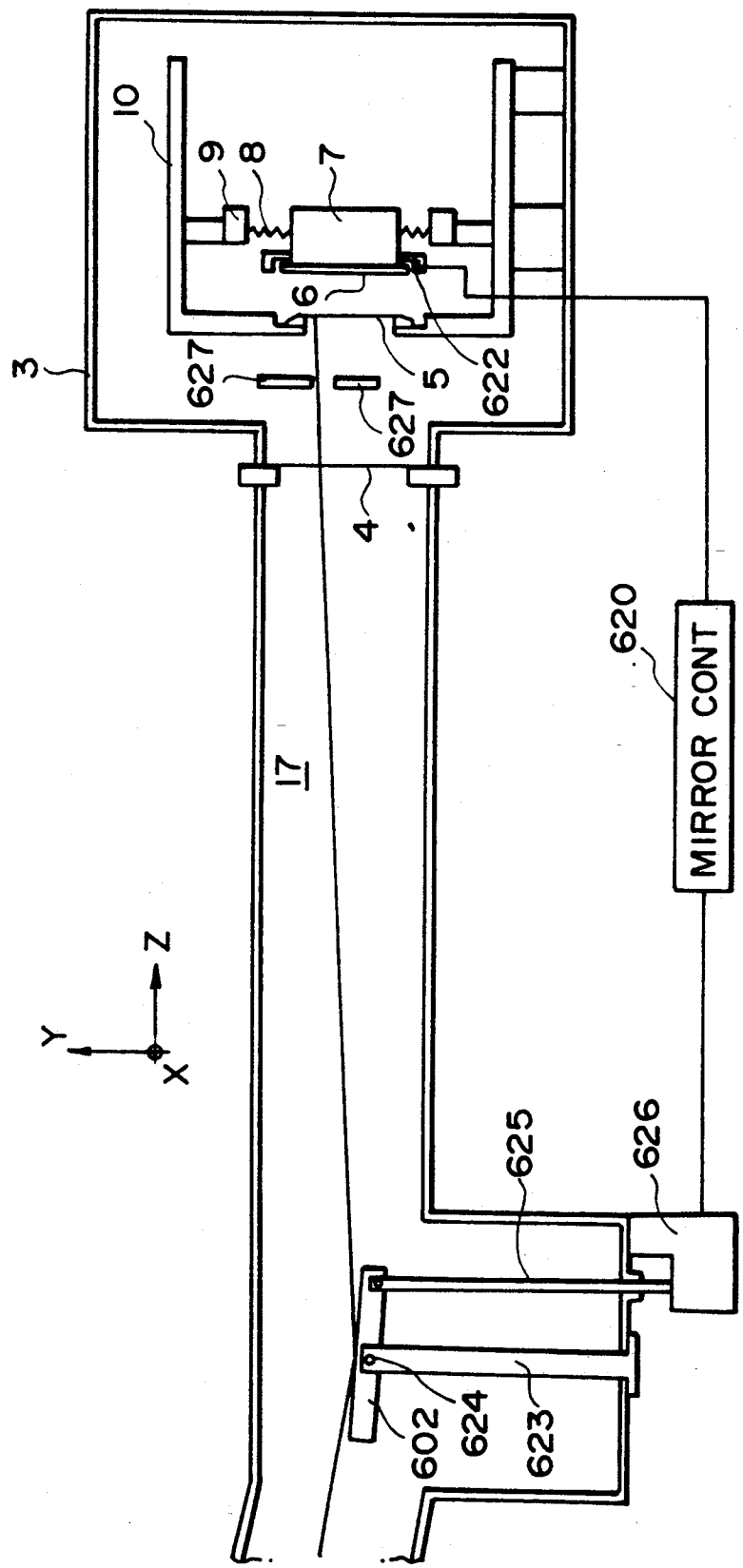
FIG. 40 is a general arrangement of an apparatus according to a further embodiment of the present invention.

FIG. 40 shows a further embodiment. In this Figure, the same reference numerals as in FIG. 38 are assigned to the corresponding elements, and detailed description of those elements are omitted for simplicity. A mirror 623 is disposed in the ultra-high vacuum ambience 17. The mirror 602 is supported by the supporting rod 623 for rotation about the axis 624. A driving rod 625 is connected to the mirror 602. The driving rod 625 is driven by a driver 626. The driver 626 is controlled by a mirror controller 620 which drives the driving rod 625 to swing the mirror 602 to scanningly illuminate the mask 5 and the wafer 6 with the SOR radiation reflected by the mirror 602.

Figure 41:
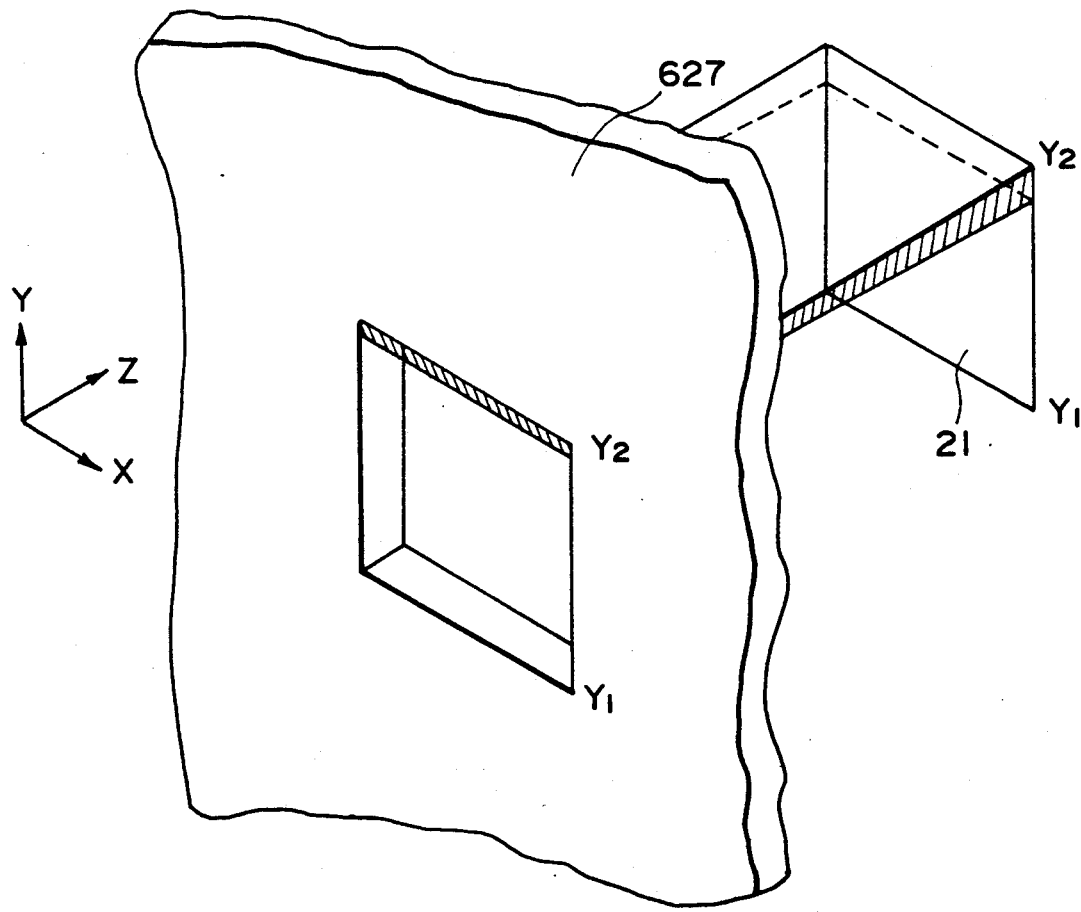
FIG. 41 is a perspective view of a shutter.

Similar to the FIG. 38 embodiment, by the X-ray detector 622 mounted on the wafer stage 7, the change of the beam intensity of the synchrotron radiation is detected while the wafer stage 7 is being moved before the exposure operation. The beam intensity I is approximated as:

$$I = I_0 e^{-t/\tau}$$

where Io is the initial intensity, and the time constant $\tau$ is determined by least square approximation by the mirror controller 620. By this, the beam intensity of the synchrotron radiation at any point of time can be calculated. FIG. 41 is an enlarged view of the shutter 627. The beam is indicated by a hatched portion. The synchrotron radiation has a Gaussian distribution in the direction perpendicular to the beam, that is, in the plain z-y. The standard deviation is approximately 1 mm in the view angle 21, as an example. It is assumed that the beam strength at time T1 when the exposure starts is 100 mW/cm², that the required amount of exposure Q is 100 mJ/cm². If the beam intensity did not attenuate, it would suffice if the beam would sweep in the z direction on the view angle 21 at the speed of 2.5 mm/sec. However, since the beam intensity attenuates, the beam sweeping speed v is preferably calculated by the controller to compensate this. The sweeping speed v of the beam in the view angle 21 is obtained from the following equation:

$$v = v_o e^{-t/\tau}$$

where $v_o$ is the sweeping speed at the time T1 of the exposure operation start.

When the beam is swept at this compensated speed, the amount of exposure within the view angle 21 is substantially uniformly 100 mJ/cm$^2$.

Figure 42:
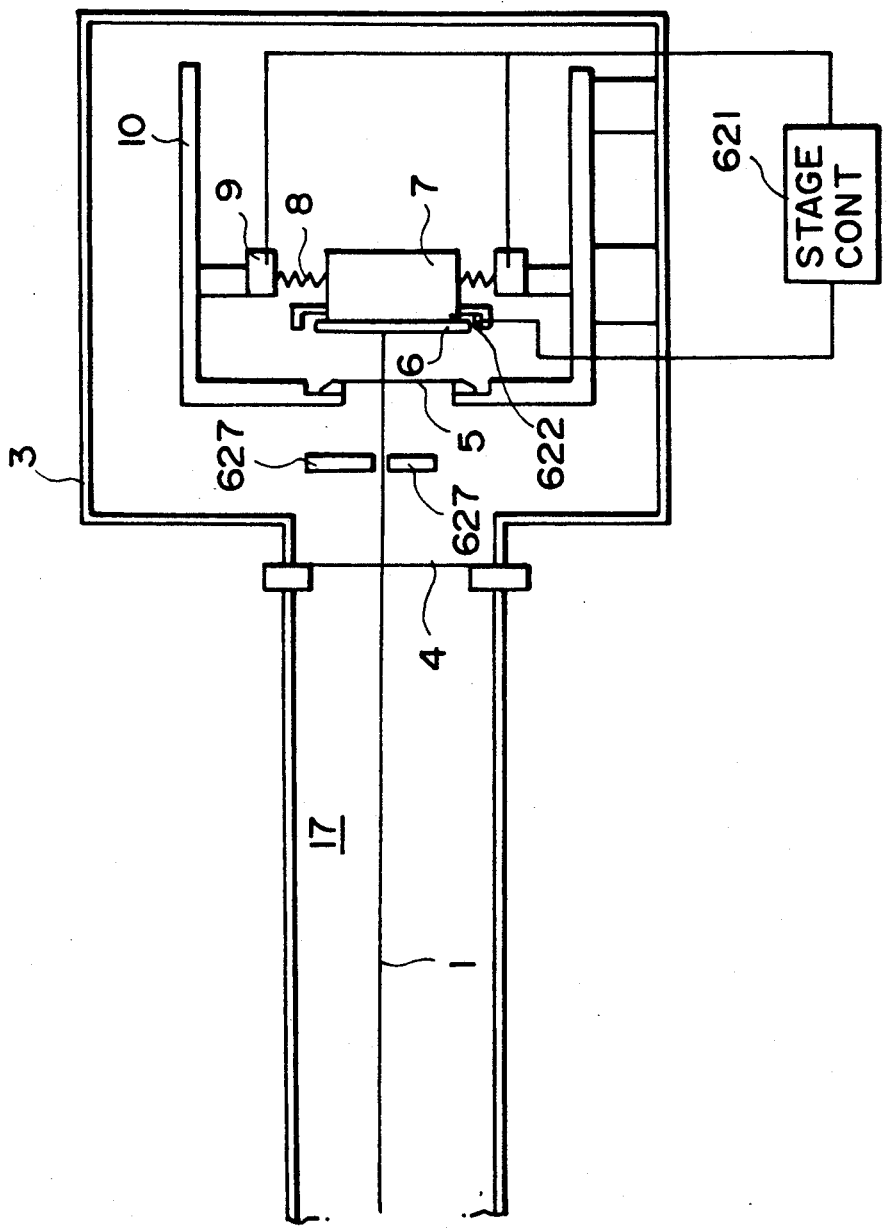
FIG. 42 is a general arrangement according to a further embodiment of the present invention.

FIG. 42 shows a further embodiment. In the embodiment of FIG. 40, the rotational speed of the mirror 602 is changed to compensate the attenuation, with time, of the beam intensity of the synchrotron radiation. However, in the present embodiment, the shutter 627 is fixed during the exposure operation, whereas the moving speed of the stage 7 is changed during the exposure for one view angle to compensate the beam intensity attenuation to provide a constant amount of exposure. The driving speed of the stage 7 is determined so that the relative positional relation between the beam and the view angle 21 is the same as that in the FIG. 40 embodiment. More particularly, the stage 7 is driven in the direction of -Y at a speed of v calculated by the stage controller 621 as follows:

$$v = v_o e^{-t/\tau}$$

When the stage 7 is driven at this speed, the amount of exposure in the view angle 21 is substantially uniformly 100 mJ/cm$^2$.

As described in the foregoing, according to this embodiment, the cumulative amount of exposure in the view angle is substantially free from variation due to the attenuation, with time, of the beam intensity, so that the resolution of the exposure apparatus can be improved.

Figure 43:
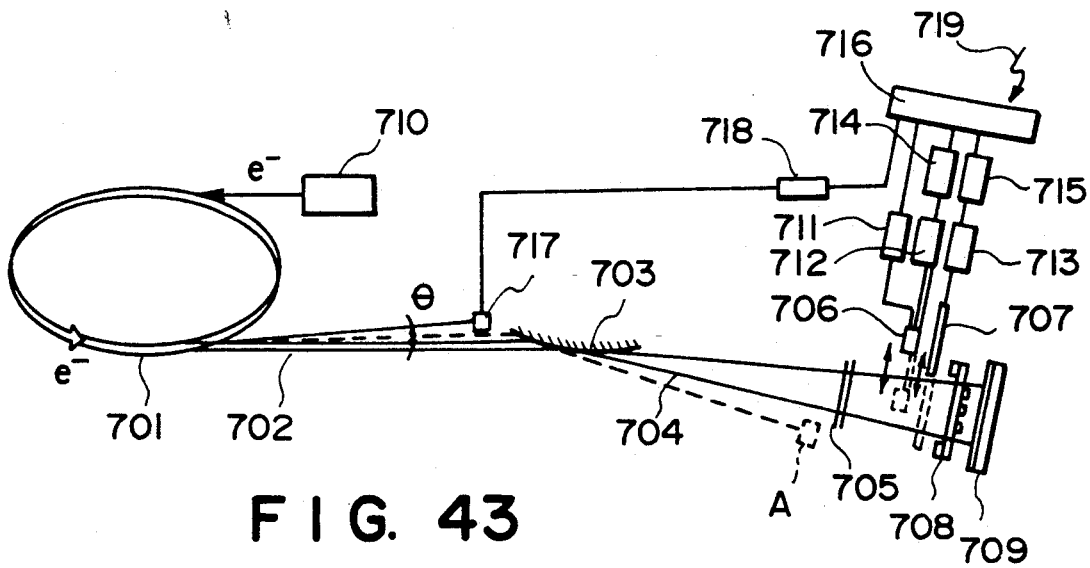
FIG. 43 is a general arrangement of an exposure apparatus according to a further embodiment of the present invention.

FIG. 43 shows an X-ray exposure apparatus according to a further embodiment, wherein a fixed mirror is used. In FIG. 43, reference numerals 701, 708 and 709 designate an SOR ring, an X-ray mask 708 and a wafer coated with sensitive resist, respectively. The apparatus comprises an X-ray mirror 703, an X-ray transmitting window covered with beryllium film or the like, a movable X-ray detector 706, a shutter 707 and an X-ray mask 708. Designated by reference numerals 702 and 704 are X-rays before and after being expanded by the X-ray mirror 703, respectively. The apparatus further comprises an electron injector 710, a signal processor 711, an X-ray detector driver 712, a shutter driver 713, an X-ray detector controller 714, a shutter controller 715, a CPU unit 716, a light or X-ray intensity detector 717, a signal processor 718 and a communication path 719. In this embodiment, the exposure radiation is always monitored by the detector 717.

Figure 45:
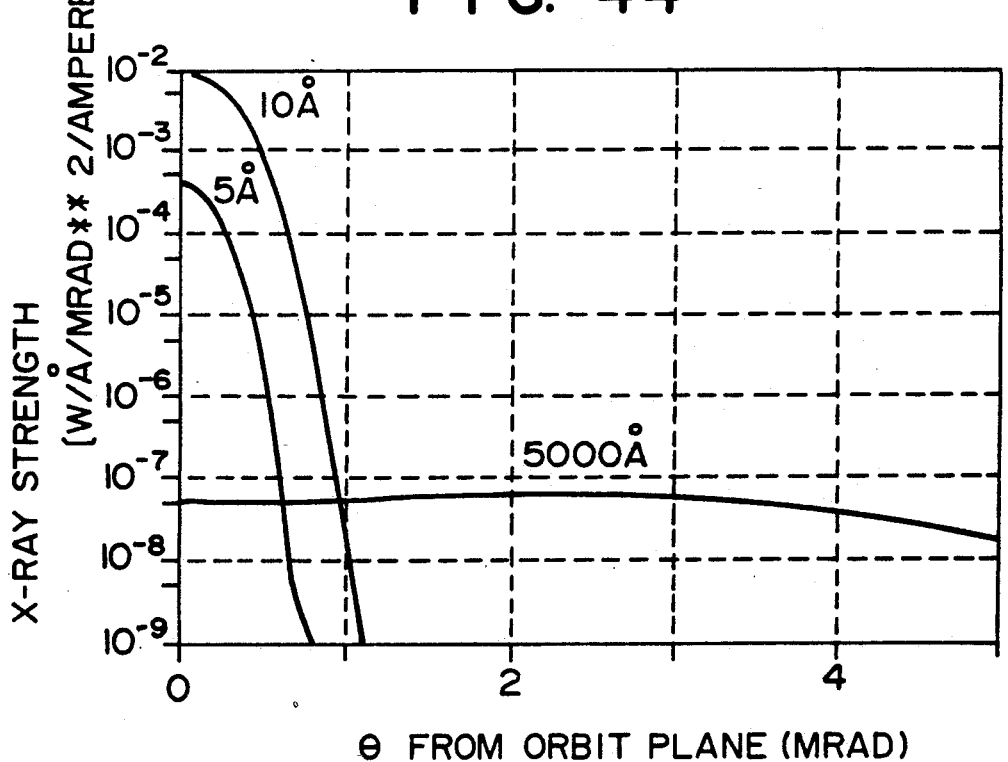
FIG. 45 shows an intensity distribution in the vertical direction of SOR.

The description will be made as to the position where the detector 717 is disposed and the characteristics of the detector 717. The position thereof may be anywhere if it does not block the exposure X-rays. However, the detector is different depending on an angle $\theta$ of the SOR ring 701 from the electron orbit plane. This is because the intensity of the SOR received at a position forming the angle $\theta$ from the orbit plane is different depending on the wavelength. For example, FIG. 45 shows the $\theta$— dependency of the SOR intensity with the parameter of the wavelength when the acceleration voltage is 600 mV, and the radius of orbit is 2 m. This abscissa represents the angle $\theta$ from the orbit plane, and the ordinate represents the SOR intensity per unit current, per unit wavelength and per unit solid angle. As will be understood from FIG. 45, the intensity of the short wavelength component is smaller than that of the long wavelength component provided that the solid angle is not more than 2 mrad. Therefore, when the detector 17 can be disposed substantially in the same plane as the orbit plane, a detector sensitive to the X-ray region or the visible region is usable. For example, the X-ray detector may be in the form of a semiconductor detector, or in the form of detecting photoelectrons from a metal wire stretched in the radiation path. However, in the range of the angle $\theta$ not less than 2-3 mrad, the intensity of the short wavelength component is lower than the long length component. Therefore, the detector in this case is preferably in the form of a photodiode or the like having sensitivity to the visible region.

Figure 44:
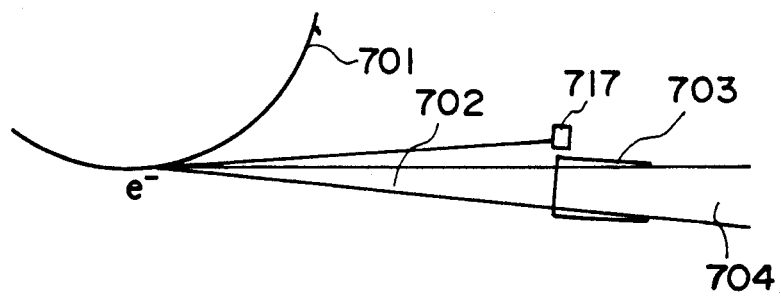
FIG. 44 shows a position of a detector which is a constituent element of the apparatus according to an embodiment of the present invention.

For example, when the detector 717 is disposed in the orbit plane, it may be disposed in the vicinity of the X-ray mirror 703 as shown in FIG. 44. As shown in FIG. 43, it may be placed at a position A behind the X-ray mirror 703.

Generally, the exposure by the SOR is started after the low energy electrons are injected by the injector 710 into the SOR ring 701, and they are accelerated up to a predetermined energy level. However, the number of electrons injected decreases by collision with gas molecules or the like remaining in the orbit in the SOR ring 701. By this, the intensity of the radiation attenuates. Therefore, the electrons are blocked and the exposure operation is interrupted when the number of orbit electrons or the intensity of the radiated X-rays lowers down to a predetermined level. Thereafter, the electrons are injected again, and the exposure is started.

The operation of the X-ray exposure apparatus of FIG. 43 will be described. While the shutter 707 is kept closed (broken lines in FIG. 43), the electrons are injected by an injector 710 into the SOR ring 701. Thereafter, the CPU unit 716 produces an intensity detection instruction, so that the X-ray intensity is detected. In this detecting operation, the X-ray detector 706 is advanced into the exposure area (broken line in FIG. 43) by the X-ray detector driver 712 through the X-ray detector controller 714, so that the X-ray intensity in the exposure area is detected. Simultaneously, the detector 717 detects the intensity of the radiated beam, and the output of the detector 717 is supplied through the signal processor 718 to the CPU unit 716. The output of the X-ray detector 706 and the detector 717 are Ix and Ipo, respectively. The detected radiation beam intensity is supplied to the CPU unit 716 through the signal processor 711, and the X-ray detector 706 is retracted to outside of the exposure area.

Immediately before the start of the exposure operation, the detector 717 again detects the radiation beam intensity Ip(t), and the CPU unit 716 calculates the X-ray intensity Ie(t) during the exposure on the basis of the radiation beam intensity detected. Then, the exposure period T is calculated from the target exposure amount D, and simultaneously, X-ray mask 708 and the wafer 709 are aligned. The exposure period T is calculated, when the X-ray intensity attenuation is small, by the following equation:

$$T = D/(Ie \times \alpha)$$

where $\alpha$ is an X-ray transmissivity of the X-ray mask 708. Subsequently, the CPU unit 716 produces an exposure instruction and supplies it to the shutter controller 715 by which the shutter driver 713 opens the shutter 707 to start the exposure. After start of the exposure operation, the shutter 707 is closed when the time period T elapses.

The description will be made as to the method of determination of the exposure period T. As shown in FIG. 45, the intensity of the SOR is different depending on the wavelength and the angle $\theta$ from the orbit plane, but it is proportional to the orbit current if the detection position is constant, as long as the acceleration voltage and the electron orbit do not change. Using the output Ip(t) of the detector 717 at the time t and the intensities Ix and Ipo detected by the simultaneous detection after the electron injection, the X-ray intensity Ie is determined by the following equation:

$$Ie = (Ip(t)Ix/Ipo) \cdot Ix \tag{7}$$

For example, it is assumed that the target exposure amount is 50 mJ/cm$^2$, and that the outputs of the X-ray intensity detector 706 and the detector 717 by the simultaneous detection after the electron injection are 150 mW/cm$^2$ and 1 (arb. unit). The output of the detector 717 is given in an arbitrary unit. Next, the output of the detector 717 is 0.5 (arb. unit) at the exposure time te, then the X-ray intensity Ie is determined by the equation (7), as follows:

$$Ie = 0.5 \times 150/1 = 75 \text{ mW/cm}^2$$

If the transmissivity $\alpha$ of the mask is 0.5, the exposure period T is from equation (1):

$$T = 4 \text{ sec.}$$

In the foregoing process, the X-ray intensity attenuation during the exposure is deemed as being negligibly small.

In this embodiment, the time t when the detector 717 detects the intensity Ip(t) is preferably immediately before the start of the exposure operation, that is, immediately before the start of the shutter 707 for the exposure control.

The description will be made as to the case where the X-ray intensity attenuation during the exposure is not negligible. In this example, the X-ray intensity is detected in real time by the detector 717, and the amount of exposure can be controlled by a cumulative exposure amount De(t).

For example, after the electron injection, the X-ray intensity detector 706 and the detector 717 detects the intensities Ix and Ipo. The output Ip(t) of the detector 717 is read at regular intervals $\Delta t$ from the point of time $t_1$ which is the time when the shutter 707 is opened, and the CPU unit 716 determines (Ix/Ipo)Ip(t)$\Delta t$ and calculates the cumulative amount of exposure Dp(t)

$$\left( = \sum_{t=t1} (Ix/Ipo)Ip(t)\Delta t \right).$$

When the cumulative exposure amount Dp/t reaches the target amount of exposure De, the shutter 707 is closed.

Figure 46:
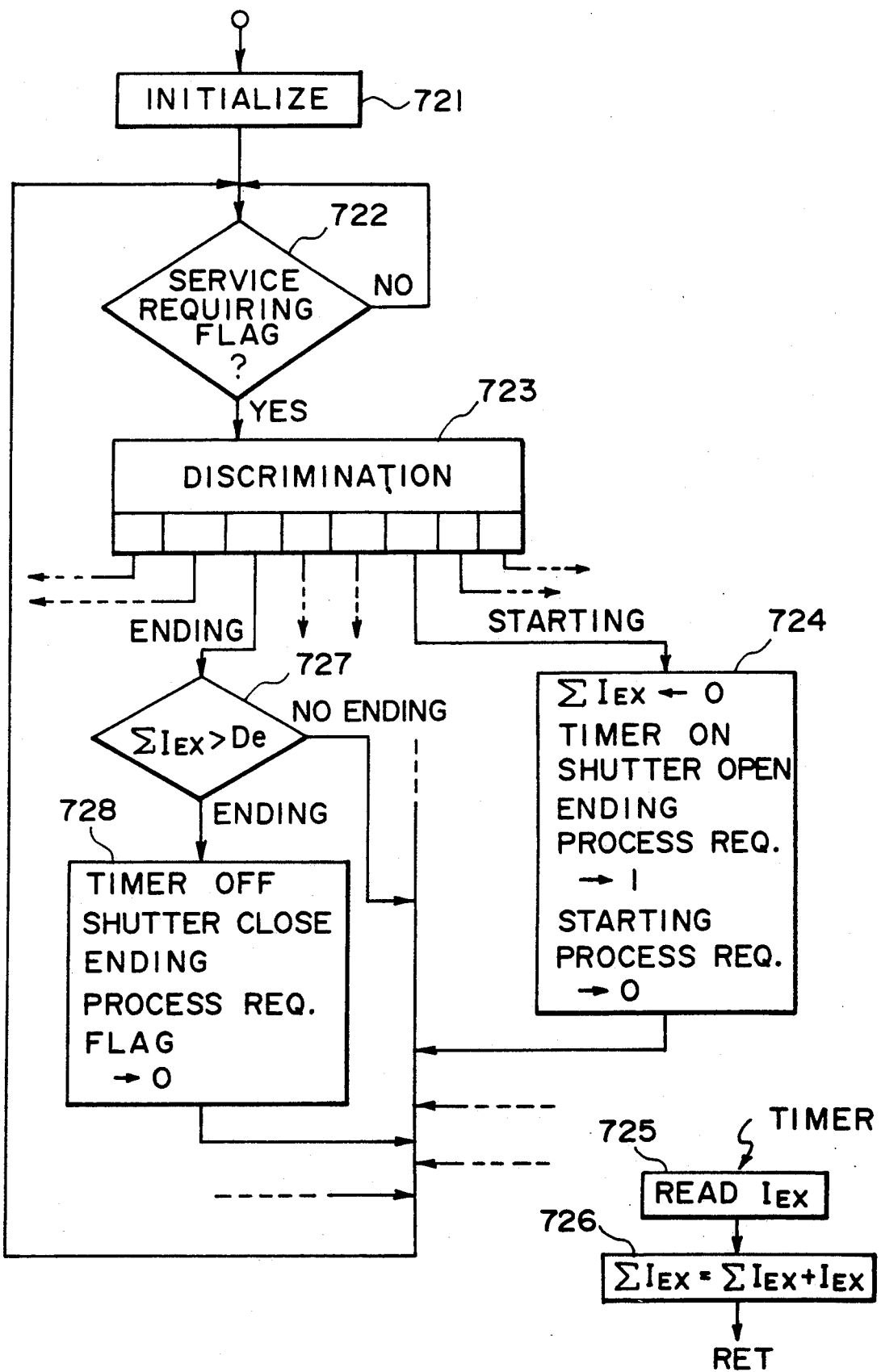
FIG. 46 is a flow chart of the operation for controlling the amount of exposure using a cumulative amount of exposure.

Referring to the flow chart of FIG. 46, the operation will be described. The CPU unit 716 controlling the exposure operation initializes the peripheral parts at step 721, and thereafter, the normal operation starts.

The exposure starting instruction is supplied through a communication path 719, and is transmitted by setting one of surface requiring flags set in step 723. The CPU unit 716 always checks whether the service requiring flag is set or not, at step 722. If one of the flags is set, the discrimination is made as to what service is required, at step 723, and the process is started on the basis of the flag. If the flag requires a start of initial processing (exposure start), the previous cumulative exposure amount $\Sigma$(Ix/Ipo)Ip(t) is cleared, and an interruption time is started. The shutter is opened, and an ending process requiring flag is set, and the current flag (initial processing requiring flag) is reset, at step 724. The actuated timer interrupts into the CPU 716 at regular intervals ($\Delta t$), and the CPU 716 executes the interruption routine to read the output Ip(t) of the light or X-ray detector 717, and the read value is added to $\Sigma$(Ix/Ipo)Ip(t), at steps 725 and 726.

When the ending process requiring flag is set, the CPU goes into the ending process sequence. In this sequence, the discrimination is made as to whether or not $\Sigma$(Ix/Ipo)Ip(t) (cumulative exposure amount) reaches the target exposure amount De, at step 727. If not, the operation returns, and if so, the interruption timer is deactuated. The shutter 707 is closed, and the current flag (ending process requiring flag) is reset, at step 728. Thus, the exposure operation is terminated.

Figure 47:
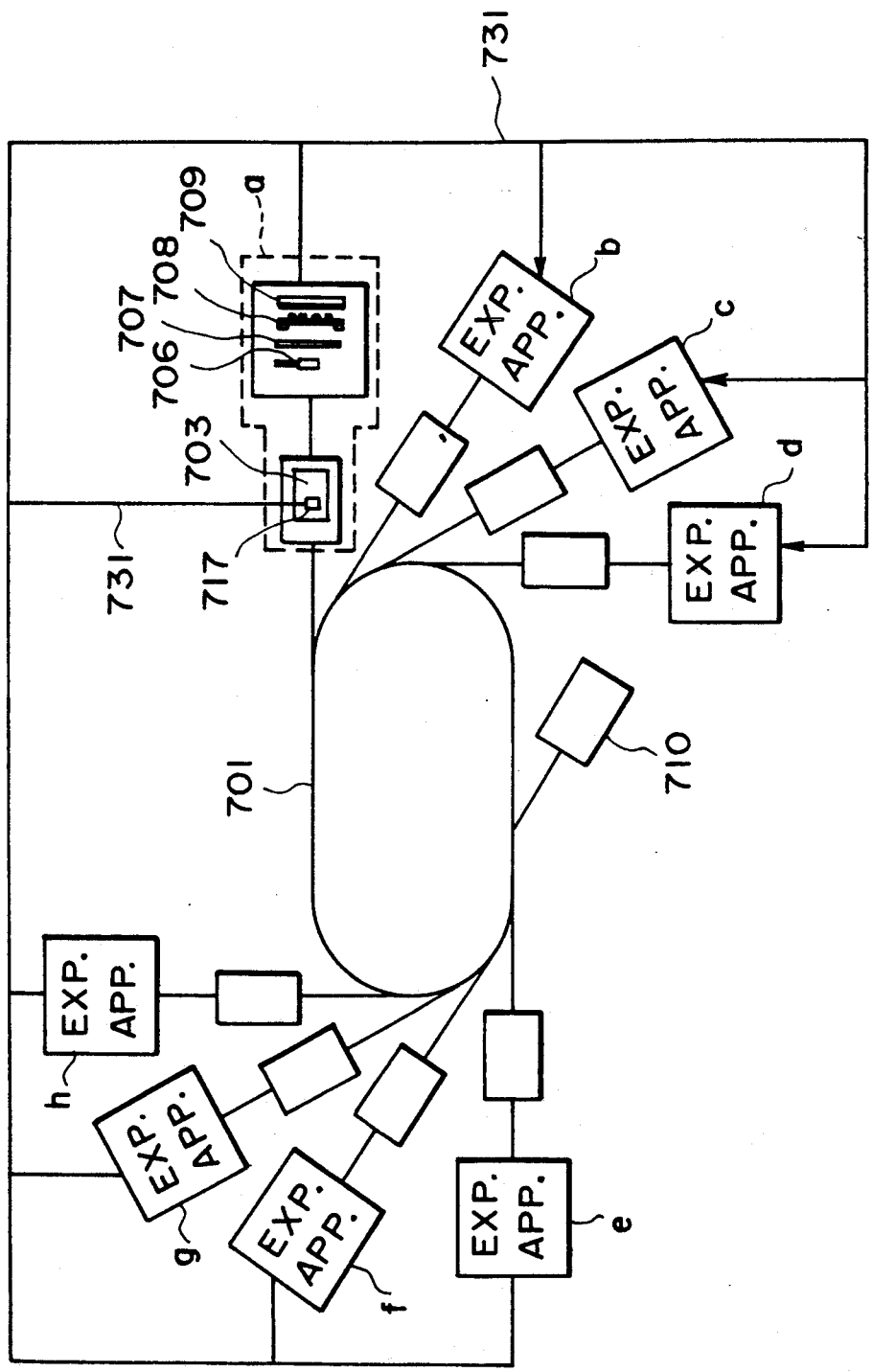
FIG. 47 shows an exposure apparatus according to a further embodiment of the present invention wherein a plurality of exposure apparatuses are provided for one SOR ring.

When a plurality of X-ray exposure apparatuses are coupled with a single SOR ring 701, the detector 717 is not necessarily provided for each of the X-ray exposure apparatuses. For example, as shown in FIG. 47, when the detector 717 is provided only for the exposure apparatus a, and when the exposure apparatuses b - h are provided only with respective X-ray detectors 706 for detecting the X-ray intensity in the respective exposure areas, the X-ray detectors 706 are advanced into the exposure areas in the respective exposure apparatuses a - h, and simultaneously with the detection of the X-ray intensity Ix, the output Ipo of the detector 717 is obtained in the apparatus a. The output Ipo of the detector 717 is transmitted through the communication path 731 to each of the exposure apparatuses a - h. Thereafter, the exposure intensity Ie of each of the apparatuses a - h is obtained from equation (7) on the basis of the output Ip(t) of the detector 717 during the exposure supplied through the communication path 731, the output Ipo and output Ix measured in each of the apparatuses a - h. An apparatus with which the detector 717 is provided, is not necessarily one of the exposure apparatuses.

According to this embodiment, the following advantageous effects can be provided:

(1) If the X-ray intensity is detected once after the electron injection, the X-ray intensity attenuation thereafter can be compensated, and therefore, the detection is efficient and highly accurate.

(2) The X-ray intensity can be obtained in real time, and therefore, it can respond to a steep change of the X-ray intensity.

(3) When the detector is in the form of a light intensity detector, it is not deteriorated by the X-rays, and therefore, the accurate detection is possible for a long period of time.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus usable with synchrotron radiation generating means for injecting electrons into a ring to produce synchrotron radiation, said apparatus comprising:
   exposure means for exposing a wafer, through a mask, to the synchrotron radiation introduced from the synchrotron radiation generating means through a window;
   intensity detecting means for detecting an intensity distribution of the synchrotron radiation; and
   control means for controlling said exposure means on the basis of the intensity distribution provided by said detecting means immediately after injection of the electrons into the ring.

2. An apparatus according to claim 1, wherein said control means comprises means for controlling said exposure means on the basis of the intensity distribution of the synchrotron radiation immediately after one of mounting and exchanging the window.

3. An apparatus according to claim 1, wherein said intensity detecting means comprises a wafer carrying stage for carrying the wafer and further comprising an X-ray detector mounted thereon.

4. An apparatus according to claim 1, wherein said exposure means comprises a shutter for controlling the amount of radiation introduced, and wherein said control means controls the shutter in accordance with the intensity distribution detected by said intensity detecting means.

5. An X-ray exposure apparatus using synchrotron radiation, said apparatus comprising:
   detecting means for detecting an intensity of X-rays after injection of electrons to generate the synchrotron radiation; and
   means for calculating an X-ray intensity during an exposure operation on the basis of a result of detection by said detecting means and on an attenuation curve of the injected electrons.

6. An exposure apparatus, comprising:
   a shutter for controlling exposure;
   a sensor for detecting an intensity of exposure radiation at a portion of an exposure area;
   a controller for controlling said shutter; and
   a signal processor for calculating a cumulative amount of exposure on the basis of the intensity of the exposure radiation detected by said sensor at the exposure area portion upon a preliminary actuation of said shutter by said controller, and for supplying an output to said controller,
   wherein said controller effects control of said shutter in accordance with the output supplied from said signal processor, to control an actual exposure operation.

7. An apparatus according to claim 6, further comprising means for moving said sensor in the exposure area, and wherein said signal processor calculates an amount of exposure from a plurality of exposure area portions.

8. An apparatus according to claim 6, wherein said controller comprises means for correcting control of said shutter on the basis of the cumulative amount of exposure fed back thereto from said signal processor.

9. An exposure apparatus, comprising:
   a shutter for controlling exposure;
   a sensor for detecting an intensity of exposure radiation at a position of an exposure area;
   a shutter driver for opening and closing said shutter; and
   calculating means for receiving outputs of said sensor when said shutter is opened and when said shutter is closed, in synchronism with opening and closing of said shutter by said shutter driver, and for processing the outputs to calculate an intensity of the exposure radiation,
   wherein said calculating means calculates the intensity of the exposure radiation by storing and processing information from said semiconductor sensor immediately before and after actuation of said shutter by said shutter driver.

10. An X-ray exposure apparatus for transferring by synchrotron radiation a pattern of a mask onto a member coated with a sensitive resist, said apparatus comprising:
    first detecting means for detecting an intensity of X-ray rays, corresponding to an exposure area; and
    second detecting means, disposed outside of the exposure area, for detecting attenuation of the synchrotron radiation.

11. An exposure apparatus comprising:
    a shutter for controlling an exposure period;
    a semiconductor sensor for detecting an intensity of exposure radiation;
    a wafer stage;
    a wafer stage driver for driving said wafer stage;
    a shutter driver for opening and closing said shutter; and
    calculating means for receiving an output of said semiconductor sensor in synchronism with opening and closing of said shutter and for processing the output to calculate an intensity of the exposure radiation,
    wherein said wafer stage, upon a detection of exposure radiation intensity by said sensor, retracts the wafer from exposure radiation, so that the wafer is not exposed to the exposure radiation during a detection.

12. An exposure apparatus comprising:
    a shutter for controlling an exposure period;
    a semiconductor sensor for detecting an intensity of exposure radiation;
    a wafer stage;
    a wafer stage driver for driving said wafer stage;
    a shutter driver for opening and closing said shutter;
    calculating means for receiving an output of said semiconductor sensor in synchronism with opening and closing of said shutter by said shutter driver, and for processing the output to calculate an intensity of the exposure radiation; and
    an auxiliary shutter for preventing the wafer from being exposed to the radiation during detection of the exposure radiation intensity by said sensor.

13. An exposure apparatus usable with an exposure radiation source, said apparatus comprising:
    a stage for supporting a member to be exposed;
    optical control means for controlling radiation projected from the exposure radiation source to the member;
    optical detecting means for detecting one of an intensity of the radiation of the radiation source and the intensity of the radiation on a surface of the member to be exposed;

driving profile determining means, coupled with said optical control means and said optical detecting means, for determining a driving profile of said optical control means based on the intensity on the surface as a function of position of the surface and based on the intensity of the radiation source, to provide a uniform amount of exposure on the surface; and driving profile compensating means for one of expanding and contracting a time axis of the driving profile in accordance with a change in the intensity of the radiation source.

14. An apparatus according to claim 13, wherein the radiation source is an X-ray source, and said optical control means comprises a movable aperture.

15. An apparatus according to claim 13, wherein the radiation source is a synchrotron radiation source, and said optical control means comprises an actuator for swinging a mirror.

16. An exposure apparatus usable with a radiation source, said apparatus comprising:
a stage for supporting a member to be exposed;
exposure control means, disposed in a radiation path between the radiation source and said stage, including a movable member for selectively limiting the radiation from said radiation source to the member;
determining means for determining a driving speed for providing a constant amount of exposure of the member to radiation, despite any attenuation, with time, of an intensity of the radiation to the member; and
driving means for driving said movable member of said exposure control means in accordance with the driving speed determined by said determining means.

17. An apparatus according to claim 16, wherein said exposure control means comprises a movable aperture stop.

18. An apparatus according to claim 16, wherein said exposure control means comprises a movable mirror.

19. An exposure apparatus usable with a radiation source, said apparatus comprising:
a stage for supporting a member to be exposed;
exposure control means, disposed in a radiation path between the radiation source and said stage, including a movable member for selectively limiting the radiation from said radiation source to the member;
determining means for determining a driving speed for providing a constant amount of exposure of the member to radiation, despite any attenuation, with time, of an intensity of the radiation to the member; and
driving means for driving said stage in accordance with the driving speed determined by said determining means.

20. An exposure method for manufacturing semiconductor devices, comprising:
injecting electrons into a ring to generate a synchrotron radiation beam;
detecting an intensity distribution of the synchrotron radiation beam immediately after injection of the electrons in said injecting step;
controlling exposure of a substrate to the synchrotron radiation beam on the basis of the detected intensity distribution.

21. A method according to 20, further comprising providing a window, which is substantially transparent to the synchrotron radiation beam, between the ring and the substrate, and effecting said detecting step with respect to the beam passed through the window.

22. A method according to claim 21, further comprising effecting detecting step immediately after the window is one of mounted and replaced.

23. A method according to claim 21, further comprising effecting said detecting step using a detector mounted on a stage for carrying the substrate.

24. A method according to claim 23, wherein the detector includes a x-ray detector, and further comprising detecting the x-rays contained in the synchrotron radiation beam with the x-ray detector.

25. A method according to claim 21, further comprising using a shutter in said exposure controlling step.

26. An exposure method for manufacturing semiconductor devices, comprising:
injecting electrons into a ring to generate a synchrotron radiation beam;
detecting an intensity distribution of x-rays in the synchrotron radiation beam after injection of the electrons in said injection step;
determining an intensity of the x-rays during a predetermined period on the basis of the detection in said detecting step and an attenuation curve of the injected electrons; and
controlling exposure of a substrate to the synchrotron radiation beam on the basis of the determination.

27. A method according to claim 26, further comprising providing a window, which is substantially transparent to the synchrotron radiation beam, between the ring and the substrate, and effecting said detecting step to the beam passed through the window.

28. A method according to claim 27, further comprising effecting said detecting step using a detector mounted on a stage for carrying the substrate.

29. A method according to claim 28, further comprising using a shutter in said controlling step.

30. An exposure method for manufacturing semiconductor devices, comprising:
opening a shutter for preliminary exposure of an exposure region;
detecting exposure radiation through the shutter by a sensor located at a position in the exposure region when the shutter is preliminarily opened in said opening step;
calculating an exposure amount of the position on the basis of the detection, and providing an information signal relating to the exposure amount;
exposing a substrate to the exposure radiation, while the shutter is controlled on the basis of the information signal, to expose the substrate to the radiation for semiconductor manufacturing.

31. A method according to claim 30, further comprising repeating the preliminary exposure for different positions of the sensor, and providing the information signal on the basis of exposure amounts calculated for the different positions.

32. A method according to claim 30, further comprising providing a window which is substantially transparent to the radiation and effecting said detecting step to radiation passed through the window.

33. A method according to claim 30, wherein the radiation includes x-rays in synchrotron radiation.

34. An exposure method for manufacturing semiconductor devices, comprising:
providing a sensor for detecting exposure radiation;
operating a shutter for controlling exposure with the exposure radiation;

detecting, immediately before and after the operation of the shutter an output of the sensor when the shutter is closed and an output of the sensor when the shutter is opened;

determining a value related to an intensity of the exposure radiation on the basis of the outputs detected in said detecting step.

35. A method according to claim 34, further comprising providing a window which is substantially transparent to the radiation and effecting said detecting step to radiation passed through the window.

36. A method according to claim 35, wherein the radiation includes x-rays in synchrotron radiation.

37. An exposure method for manufacturing semiconductor devices, comprising:

providing an exposure control mechanism for controlling exposure of a substrate to exposure radiation, and operating the exposure control mechanism on the basis of a driving profile;

performing one of expanding and contracting a time base of the driving profile in accordance with a change in an intensity property of the exposure radiation determined on the basis of detecting the exposure radiation to determine a corrected driving profile; and operating the exposure control mechanism in accordance with the corrected profile to expose the substrate to the exposure radiation.

38. A method according to claim 37, further comprising providing a window which is substantially transparent to the radiation and effecting said detecting step to radiation passed through the window.

39. A method according to claim 38, wherein the radiation includes x-rays in synchrotron radiation.

40. An exposure method for manufacturing semiconductor devices, comprising:

providing an exposure control mechanism for controlling exposure of a substrate to exposure radiation, and driving a movable member at a predetermined speed by the exposure control mechanism;

determining the driving speed of the movable member in accordance with attenuation of intensity of the exposure radiation with time; and moving the movable member at the predetermined driving speed, while exposing the substrate.

41. A method according to claim 40, further comprising providing a window which is substantially transparent to the radiation, and detecting radiation passed through the window.

42. A method according to claim 41, wherein the radiation includes x-rays in synchrotron radiation.

43. An exposure method for manufacturing semiconductor devices, comprising:

providing an exposure control mechanism for controlling exposure of a substrate to exposure radiation, and driving a stage carrying the substrate at a predetermined speed by the exposure control mechanism;

determining the driving speed of the stage in accordance with attenuation of intensity of the exposure radiation with time; and moving the stage at the predetermined driving speed, while exposing the substrate.

44. A method according to claim 43, further comprising providing a window which is substantially transparent to the radiation and detecting radiation passed through the window.

45. A method according to claim 44, wherein the radiation includes x-rays in synchrotron radiation.

46. An exposure method for manufacturing semiconductor devices, comprising:

obtaining information, related to intensity of x-rays contained in a synchrotron radiation beam supplied to an exposure region, by a first detector disposed in the exposure region;

retracting the first detector outside the exposure region;

detecting attenuation of the synchrotron radiation beam with a second sensor disposed outside the exposure region; and controlling exposure of the exposure region on the basis of outputs of the first and second sensors.

47. A method according to claim 46, further comprising providing a window which is substantially transparent to the radiation and effecting said detecting step to radiation passed through the window.

* * * * *

UNITED STATES PATENT AND TRADEMARK OFFICE
CERTIFICATE OF CORRECTION

PATENT NO. : 5,157,700                                  Page 1 of 3
DATED      : October 20, 1992
INVENTOR(S): Hiroshi Kurosawa, et al.

It is certified that error appears in the above-identified patent and that said Letters Patent is hereby corrected as shown below:

ON THE TITLE PAGE

UNDER "U.S. PATENT DOCUMENTS"

After the first-listed patent, the following should be inserted:
--4,465,368 8/1984 Matsuura, et al. .... 356/218--; and
"Tanimoba et al." should read --Tanimoto et al.--.

After the listing of the U.S. patents, the following should be inserted:

--FOREIGN PATENT DOCUMENTS 0083394 7/1983 EPA.

OTHER PUBLICATIONS

Patent Abstracts of Japan, Kokai No. 56-104438, Vol. 5, No. 179, November 17, 1981.
Patent Abstracts of Japan, Kokai No. 60-7722, Vol. 9, No. 118, May 23, 1985.
Patent Abstracts of Japan, Kokai No. 60-198726, Vol. 10, No. 42, February 19, 1986.
Takada, et al., "Development of a Compact Synchrotron Radiation System For X-Ray Lithography," Optical Engineering, Vol. 27, No. 7, July 1988, pages 550 through 556.--.

UNITED STATES PATENT AND TRADEMARK OFFICE
CERTIFICATE OF CORRECTION

PATENT NO. : 5,157,700
DATED : October 20, 1992
INVENTOR(S) : Hiroshi Kurosawa, et al.

It is certified that error appears in the above-identified patent and that said Letters Patent is hereby corrected as shown below:

IN THE DISCLOSURE

COLUMN 3

Line 43, "determined:" should read --determined;--.

COLUMN 12

Line 45, "tm" should read --Pm--.

COLUMN 15

Line 28, "pulsewisely" should read --pulsewise--.

COLUMN 28

Line 10, "a x-ray" should read --an X-ray--;
Line 11, "x-rays" should read --X-rays--;
Line 12, "x-rays" should read --X-rays--;
Line 19, "x-rays" should read --X-rays--;
Line 22, "x-rays" should read --X-rays--; and
Line 63, "x-rays" should read --X-rays--.

UNITED STATES PATENT AND TRADEMARK OFFICE
CERTIFICATE OF CORRECTION

PATENT NO. : 5,157,700

DATED : October 20, 1992

INVENTOR(S) : Hiroshi Kurosawa, et al.

It is certified that error appears in the above-identified patent and that said Letters Patent is hereby corrected as shown below:

COLUMN 29

Line 2, "shutter" should read --shutter,--;
    Line 13, "x-rays" should read --X-rays--; and
    Line 35, "x-rays" should read --X-rays--.

COLUMN 30

Line 8, "x-rays" should read --X-rays--;
    Line 26, "x-rays" should read --X-rays--; and
    Line 29, "x-rays" should read --X-rays--.

Signed and Sealed this

Nineteenth Day of April, 1994

Attest:

BRUCE LEHMAN

Attesting Officer     Commissioner of Patents and Trademarks